(12) United States Patent
Hikosaka et al.

(10) Patent No.: US 9,064,997 B2
(45) Date of Patent: *Jun. 23, 2015

(54) SEMICONDUCTOR LIGHT EMITTING DEVICE, NITRIDE SEMICONDUCTOR LAYER GROWTH SUBSTRATE, AND NITRIDE SEMICONDUCTOR WAFER

(71) Applicant: Kabushiki Kaisha Toshiba, Minato-ku (JP)

(72) Inventors: Toshiki Hikosaka, Kanagawa-ken (JP); Yoshiyuki Harada, Tokyo (JP); Maki Sugai, Kanagawa-ken (JP); Shinya Nunoue, Chiba-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/330,151

(22) Filed: Jul. 14, 2014

(65) Prior Publication Data

US 2014/0319460 A1 Oct. 30, 2014

Related U.S. Application Data

(62) Division of application No. 13/404,553, filed on Feb. 24, 2012, now Pat. No. 8,823,016.

(30) Foreign Application Priority Data

May 24, 2011 (JP) .................................. 2011-115583

(51) Int. Cl.
*H01L 33/06* (2010.01)
*H01L 33/12* (2010.01)
*H01L 33/32* (2010.01)
*H01L 33/00* (2010.01)
*C30B 29/40* (2006.01)

(52) U.S. Cl.
CPC .............. *H01L 33/06* (2013.01); *H01L 33/007* (2013.01); *H01L 33/12* (2013.01); *C30B 29/406* (2013.01); *H01L 33/32* (2013.01)

(58) Field of Classification Search
USPC ............................................................ 257/77
See application file for complete search history.

(56) References Cited

U.S. PATENT DOCUMENTS 8,823,016 B2 * 9/2014 Hikosaka et al. ............... 257/77
2010/0025684 A1 2/2010 Shinohara et al.
2012/0299014 A1* 11/2012 Hikosaka et al. ............... 257/77

FOREIGN PATENT DOCUMENTS

| JP | 2002-164296 | 6/2002 |
|---|---|---|
| JP | 2007-150376 | 6/2007 |
| JP | 2009-123717 A | 6/2009 |
| JP | 4356723 | 11/2009 |

OTHER PUBLICATIONS

Submission of Publication issued Oct. 21, 2013 in Japanese Patent Application No. 2012-171798 (with English language translation).

* cited by examiner

*Primary Examiner* — Zandra Smith
*Assistant Examiner* — Lawrence Tynes, Jr.
(74) *Attorney, Agent, or Firm* — Oblon, McClelland, Maier & Neustadt, L.L.P.

(57) ABSTRACT

According to one embodiment, a semiconductor light emitting device includes a first semiconductor layer of a first conductivity type and having a major surface, a second semiconductor layer of a second conductivity type, and a light emitting layer provided between the first and second semiconductor layers. The major surface is opposite to the light emitting layer. The first semiconductor layer has structural bodies provided in the major surface. The structural bodies are recess or protrusion. A centroid of a first structural body aligns with a centroid of a second structural body nearest the first structural. hb, rb, and Rb satisfy $rb/(2 \cdot hb) \leq 0.7$, and $rb/Rb < 1$, where hb is a depth of the recess, rb is a width of a bottom portion of the recess, and Rb is a width of the protrusion.

50 Claims, 13 Drawing Sheets

| | ra (μm) | Ra (μm) | ha (μm) | Ta (μm) | $\frac{ra}{2 \cdot ha}$ | $\frac{ra}{Ra}$ | Sr | $\frac{ha}{Ta-Ra-ra}$ | Pg | Sg |
|---|---|---|---|---|---|---|---|---|---|---|
| spl-1 | 2.3 | 1.5 | 1 | 5 | 1.15 | 1.53 | 0.35 | 0.83 | GROWTH | GROWTH |
| spl-5 | 2.3 | 1.1 | 1 | 5 | 1.15 | 2.09 | 0.43 | 0.63 | GROWTH | GROWTH |
| spl-6 | 2.3 | 2.3 | 1 | 7 | 1.15 | 1.00 | 0.17 | 0.42 | GROWTH | NONGROWTH |
| spl-7 | 1.3 | 1.3 | 1 | 3 | 0.65 | 1.00 | 0.24 | 2.5 | GROWTH | GROWTH |
| spl-2 | 1.0 | 2.3 | 1 | 5 | 0.5 | 0.43 | 0.05 | 0.59 | NONGROWTH | NONGROWTH |
| spl-3 | 1.0 | 1.6 | 1 | 5 | 0.5 | 0.63 | 0.06 | 0.42 | NONGROWTH | NONGROWTH |
| spl-4 | 1.4 | 1.9 | 1 | 5 | 0.7 | 0.74 | 0.11 | 0.59 | NONGROWTH | NONGROWTH |

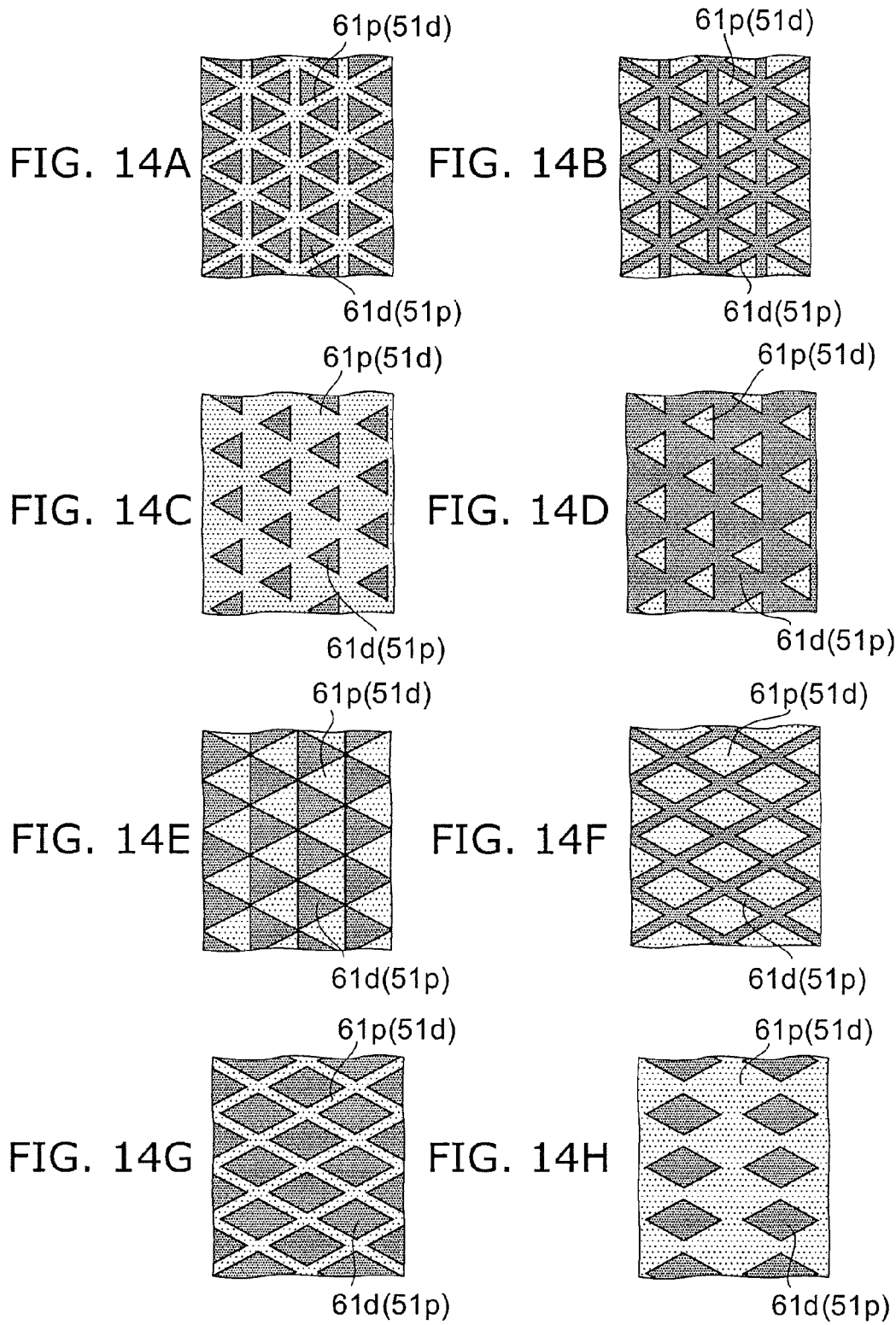

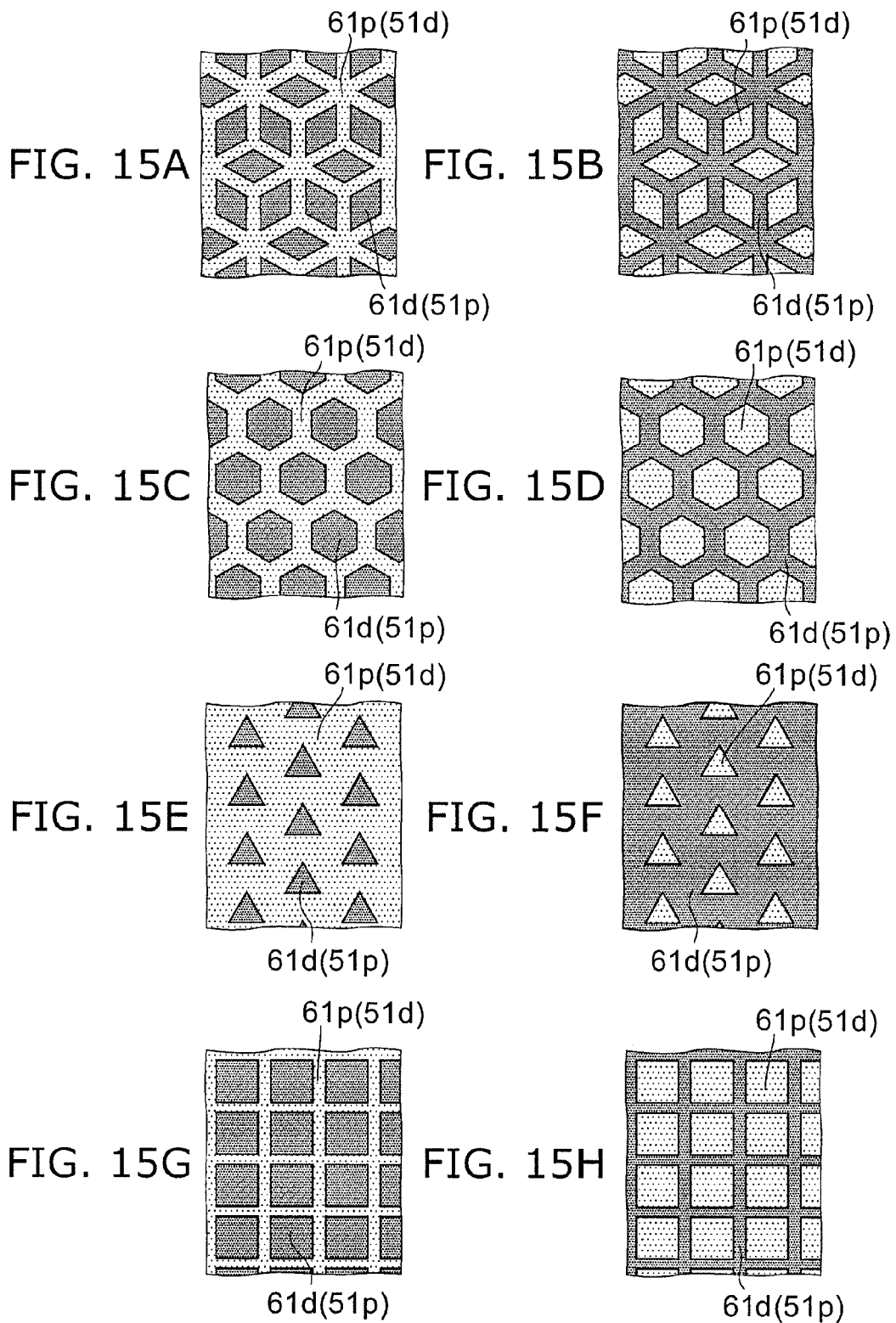

SEMICONDUCTOR LIGHT EMITTING DEVICE, NITRIDE SEMICONDUCTOR LAYER GROWTH SUBSTRATE, AND NITRIDE SEMICONDUCTOR WAFER

CROSS-REFERENCE TO RELATED APPLICATIONS

This application is a division of and claims the benefit of priority under 35 U.S.C. §120 from U.S. Ser. No. 13/404,553 filed Feb. 24, 2012, and claims the benefit of priority under 35 U.S.C. §119 from Japanese Patent Application No. 2011-115583 filed May 24, 2011; the entire contents of each of which are incorporated herein by reference.

FIELD

Embodiments described herein relate generally to a semiconductor light emitting device, a nitride semiconductor layer growth substrate, and a nitride semiconductor wafer.

BACKGROUND

Semiconductor light emitting devices such as ultraviolet, blue, or green light emitting diodes (LEDs) and bluish-violet or blue laser diodes (LDs) that use nitride semiconductors such as gallium nitride and the like have been developed.

It is desirable to increase the external quantum efficiency to increase the luminous efficiency of nitride semiconductor light emitting devices. To increase the external quantum efficiency, it is important to increase the light extraction efficiency.

There exists a configuration to increase the light extraction efficiency by patterning an unevenness in a substrate used to grow the nitride semiconductor layer. In such a configuration, there are cases where pits form when filling the unevenness, the surface flatness degrades, and the external quantum efficiency decreases.

BRIEF DESCRIPTION OF THE DRAWINGS

FIG. 14A to FIG. 14H and FIG. 15A to FIG. 15H are schematic plan views illustrating semiconductor light emitting devices according to the first embodiment.

DETAILED DESCRIPTION

Figure 1:
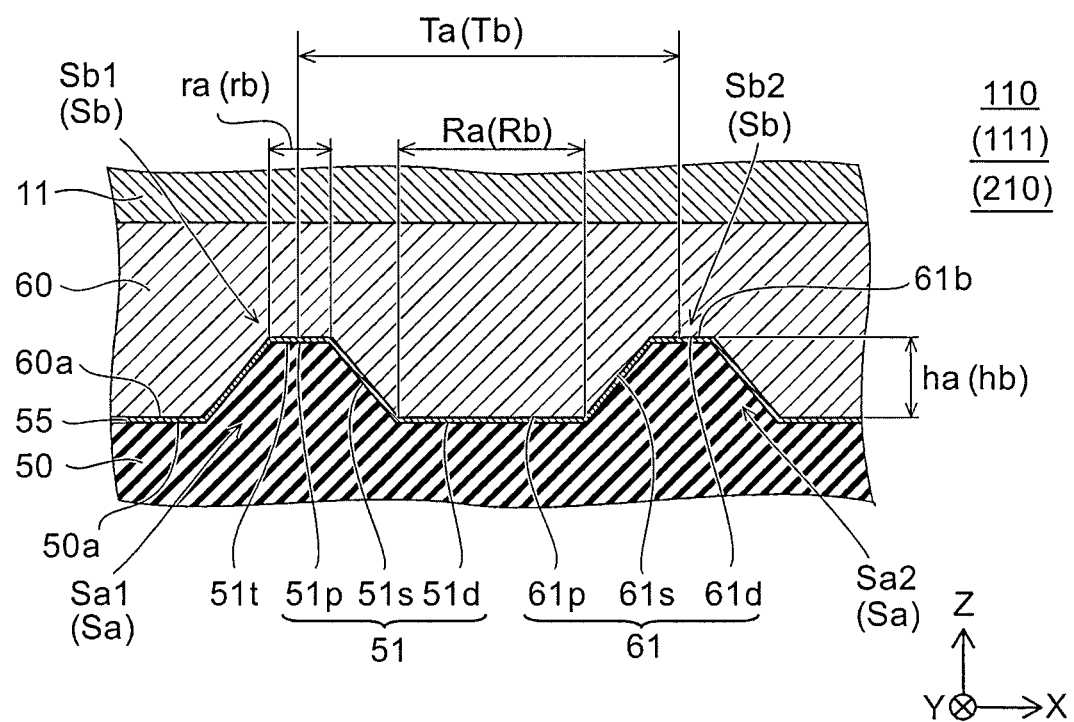
FIG. 1 is a schematic cross-sectional view illustrating a semiconductor light emitting device according to a first embodiment.

According to one embodiment, a semiconductor light emitting device includes a first semiconductor layer including a layer of a first conductivity type and having a first major surface; a second semiconductor layer including a layer of a second conductivity type different from the first conductivity type; and a light emitting layer provided between the first semiconductor layer and the second semiconductor layer. The first major surface is on a side of the first semiconductor layer opposite to the light emitting layer. The first semiconductor layer has a plurality of structural bodies provided in the first major surface. Each of the structural bodies is a recess provided on the first major surface with a protrusion provided between the structural bodies, or each of the structural bodies is a protrusion provided on the first major surface with a recess provided between the structural bodies. The structural bodies include a first structural body and a second structural body nearest the first structural body when viewed along a first axis perpendicular to the first major surface. A configuration of the first structural body when viewed along the first axis has a first centroid. A configuration of the second structural body when viewed along the first axis has a second centroid. The first centroid aligns with the second centroid along a second axis perpendicular to the first axis. hb, rb, and Rb satisfy rb/(2·hb)≤0.7, and rb/Rb<1, where hb is a depth of the recess, rb is a width of a bottom portion of the recess along the second axis, and Rb is a width of the protrusion along the second axis.

According to another embodiment, a nitride semiconductor layer growth substrate has a substrate major surface and a plurality of substrate structural bodies provided in the substrate major surface. The substrate major surface is used to grow a nitride semiconductor layer. Each of the substrate structural bodies is a substrate protrusion provided on the substrate major surface with a substrate recess provided between the substrate structural bodies, or each of the substrate structural bodies is a substrate recess provided on the substrate major surface with a substrate protrusion provided between the substrate structural bodies. The substrate structural bodies include a first substrate structural body and a second substrate structural body nearest the first substrate structural body when viewed along a first axis perpendicular to the substrate major surface. A configuration of the first substrate structural body when viewed along the first axis has a first centroid. A configuration of the second substrate structural body when viewed along the first axis has a second centroid. The first centroid aligns with the second centroid along a second axis perpendicular to the first axis. ha, ra, and Ra satisfy ra/(2·ha)≤0.7, and ra/Ra<1, where ha is a height of the substrate protrusion, ra is a width of a substrate apical portion of the substrate protrusion along the second axis, and Ra is a width of the substrate recess along the second axis.

According to another embodiment, a nitride semiconductor wafer includes a substrate and a nitride semiconductor layer. The substrate has a substrate major surface and a plurality of substrate structural bodies provided in the substrate major surface. The nitride semiconductor layer is provided on the substrate major surface. The substrate structural bodies contact the nitride semiconductor layer. Each of the substrate structural bodies is a substrate protrusion provided on the substrate major surface with a substrate recess provided between the substrate structural bodies, or each of the substrate structural bodies is a substrate recess provided on the substrate major surface with a substrate protrusion provided between the substrate structural bodies. The substrate structural bodies include a first substrate structural body and a second substrate structural body nearest the first substrate structural body when viewed along a first axis perpendicular to the substrate major surface. A configuration of the first substrate structural body when viewed along the first axis has a first centroid. A configuration of the second substrate structural body when viewed along the first axis has a second centroid. The first centroid aligns with the second centroid along a second axis perpendicular to the first axis. ha, ra, and Ra satisfy ra/(2·ha)≤0.7, and ra/Ra<1, where ha is a height of the substrate protrusion, ra is a width of a substrate apical portion of the substrate protrusion along the second axis, and Ra is a width of the substrate recess along the second axis.

Various embodiments will be described hereinafter with reference to the accompanying drawings.

The drawings are schematic or conceptual; and the relationships between the thicknesses and the widths of portions, the proportions of sizes between portions, and the like are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

Figure 2A:
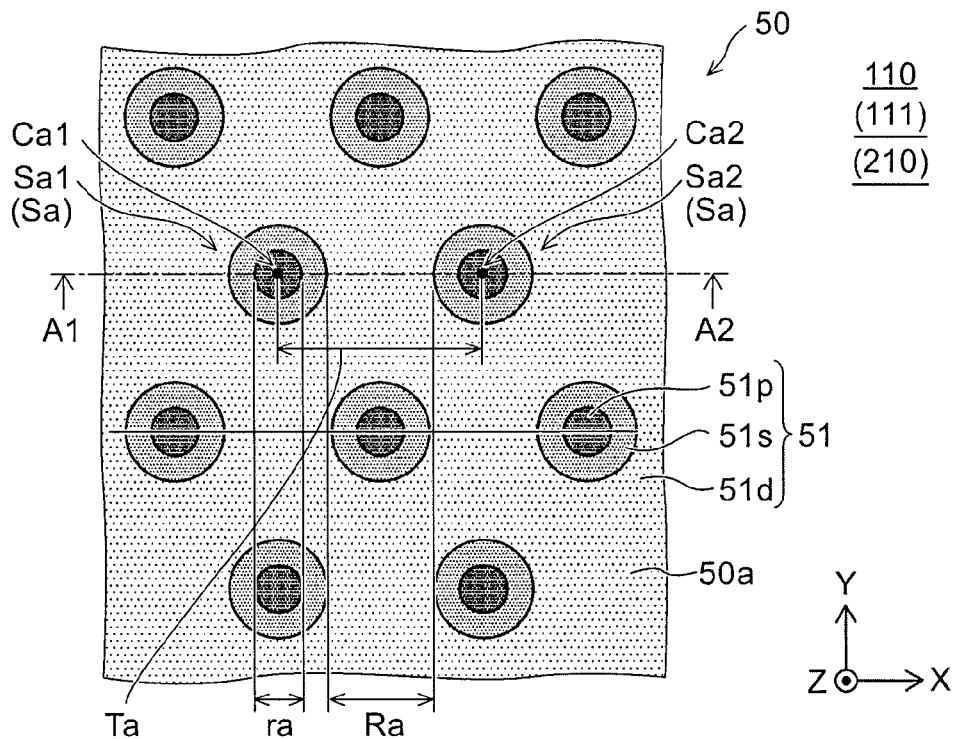
FIG. 2A and FIG. 2B are schematic plan views illustrating the semiconductor light emitting device according to the first embodiment.
Figure 2B:
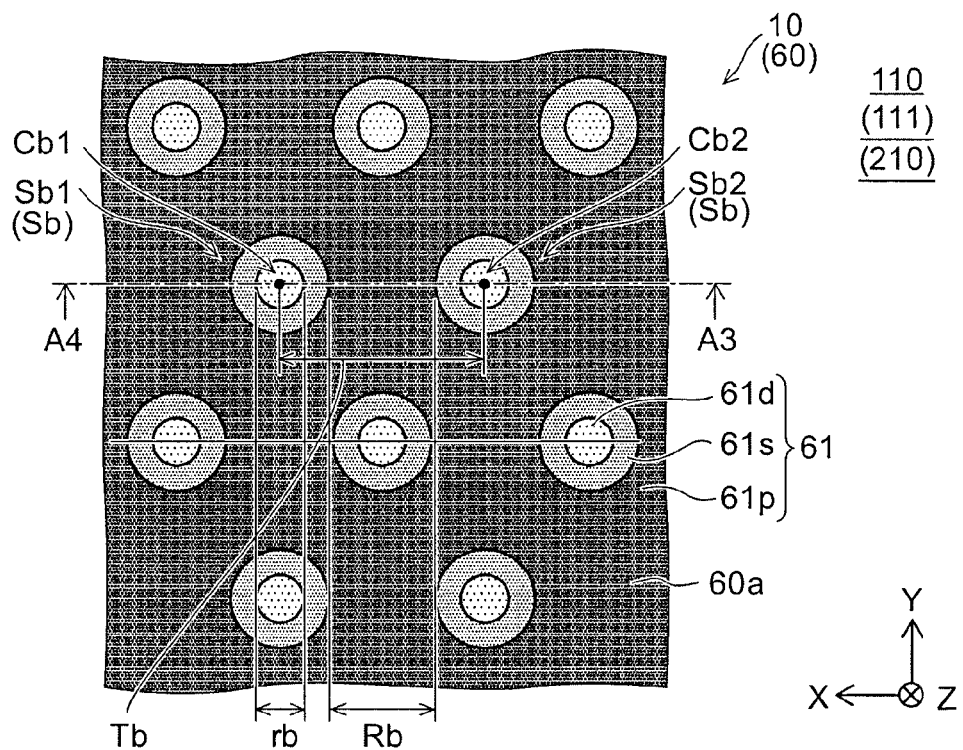

FIG. 1 is a schematic cross-sectional view illustrating the configuration of a semiconductor light emitting device according to a first embodiment. FIG. 2A and FIG. 2B are schematic plan views illustrating the configuration of the semiconductor light emitting device according to the first embodiment.

Figure 3:
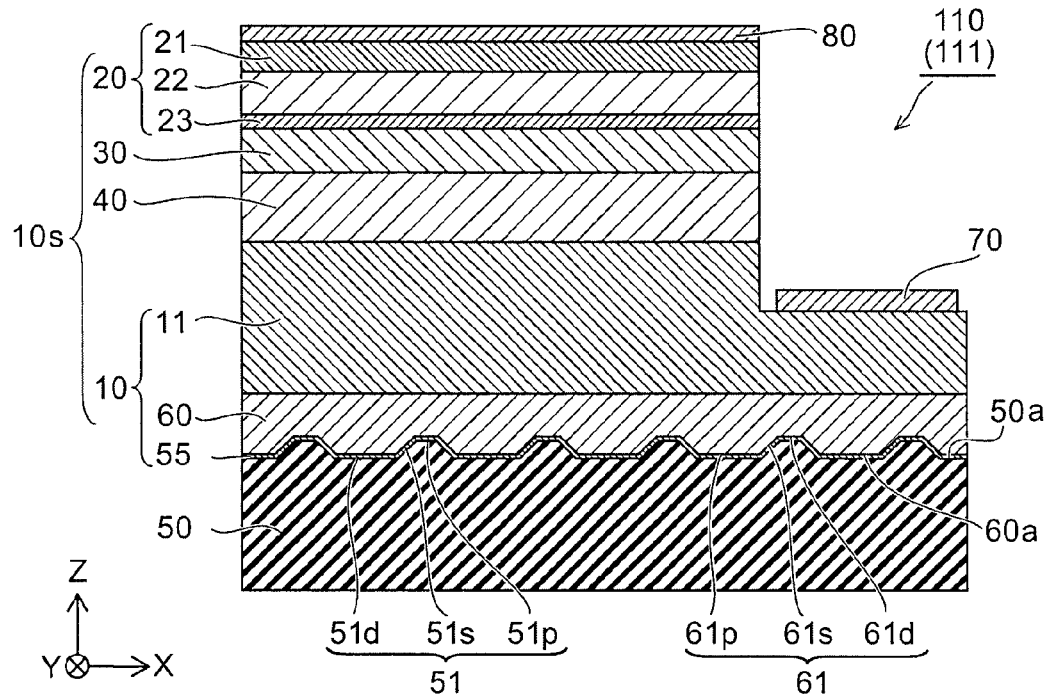
FIG. 3 is a schematic cross-sectional view illustrating the semiconductor light emitting device according to the first embodiment.

FIG. 3 is a schematic cross-sectional view illustrating the configuration of the semiconductor light emitting device according to the first embodiment. First, an overview of the configuration of the semiconductor light emitting device according to the embodiment will be described using FIG. 3.

As illustrated in FIG. 3, the semiconductor light emitting device 110 according to the embodiment includes a first semiconductor layer 10, a second semiconductor layer 20, and a light emitting layer 30.

The first semiconductor layer 10 includes a layer of a first conductivity type. The second semiconductor layer 20 includes a layer of a second conductivity type. The second conductivity type differs from the first conductivity type. The light emitting layer 30 is provided between the first semiconductor layer 10 and the second semiconductor layer 20.

For example, the first semiconductor layer 10, the second semiconductor layer 20, and the light emitting layer 30 include a nitride semiconductor.

For example, the first conductivity type is an n type; and the second conductivity type is a p type. However, the embodiment is not limited thereto. The first conductivity type may be the p type; and the second conductivity type may be the n type. Hereinbelow, the case is described where the first conductivity type is the n type and the second conductivity type is the p type.

Herein, a direction from the first semiconductor layer 10 toward the second semiconductor layer 20 is taken as a Z-axis direction. The Z-axis is taken as a first axis. One axis perpendicular to the Z-axis is taken as an X-axis. A direction perpendicular to the Z-axis and the X-axis is taken as a Y-axis. For convenience of description herein, "up" may refer to a direction from the first semiconductor layer 10 toward the second semiconductor layer 20, and "down" may refer to a direction from the second semiconductor layer 20 toward the first semiconductor layer 10.

The Z-axis is parallel to the stacking direction of the first semiconductor layer 10, the light emitting layer 30, and the second semiconductor layer 20 in a semiconductor structural body 10s (a nitride semiconductor layer) that includes the first semiconductor layer 10, the light emitting layer 30, and the second semiconductor layer 20.

In the specification of the application, stacking includes not only the case of being overlaid in direct contact but also the case of being overlaid with another component inserted therebetween.

In this example, the semiconductor structural body 10s further includes a multilayered film body 40. The multilayered film body 40 is provided between the first semiconductor layer 10 and the light emitting layer 30. The multilayered film body 40 is, for example, a superlattice layer. The multilayered film body 40 is, for example, the n type. The multilayered film body 40 may be provided if necessary and may be omitted. The multilayered film body 40 can be considered to be included in the first semiconductor layer 10.

In this example, the first semiconductor layer 10 includes a buffer layer 55, a foundation layer 60, and an n-side contact layer 11. The foundation layer 60 is provided between the buffer layer 55 and the light emitting layer 30. The n-side contact layer 11 is provided between the foundation layer 60 and the light emitting layer 30. The buffer layer 55 may include, for example, a GaN layer. The foundation layer 60 may include, for example, an undoped GaN layer. The n-side contact layer 11 may include, for example, an n-type GaN layer. The n-side contact layer 11 corresponds to a layer of the first conductivity type included in the first semiconductor layer 10.

In this example, the second semiconductor layer 20 includes a first p-side layer 21, a second p-side layer 22, and a third p-side layer 23. The light emitting layer 30 is provided between the first p-side layer 21 and the first semiconductor layer 10. The second p-side layer 22 is provided between the first p-side layer 21 and the light emitting layer 30. The third p-side layer 23 is provided between the second p-side layer 22 and the light emitting layer 30.

The first p-side layer 21 functions as, for example, a p-side contact layer. The first p-side layer 21 may include, for example, a p-type GaN layer. The second p-side layer 22 may include, for example, a p-type GaN layer. The third p-side layer 23 may include, for example, a p-type AlGaN layer. The first p-side layer 21, the second p-side layer 22, and the third p-side layer 23 correspond to a layer of the second conductivity type included in the second semiconductor layer 20.

Examples of the light emitting layer 30 and the multilayered film body 40 are described below.

In this example, the semiconductor light emitting device 110 further includes a substrate 50. The first semiconductor layer 10 is provided between the substrate 50 and the light emitting layer 30. The Z-axis is perpendicular to a major surface (a substrate major surface 50a) of the substrate 50. The substrate 50 may include, for example, sapphire, silicon carbide (SiC), a silicon (Si) substrate, gallium arsenide (GaAs), and the like.

For example, the semiconductor structural body 10s is formed on the major surface (the substrate major surface 50a) of the substrate 50. Namely, the buffer layer 55 is formed on the substrate major surface 50a; the foundation layer 60 is formed on the buffer layer 55; the n-side contact layer 11 is formed on the foundation layer 60; the light emitting layer 30 is formed on the n-side contact layer 11; and the second semiconductor layer 20 is formed on the light emitting layer 30. The substrate 50 may be separated after the semiconductor structural body 10s is formed on the substrate major surface 50a of the substrate 50. The buffer layer 55 may be removed when separating the substrate 50. At least a portion of the buffer layer 55 may remain after separating the substrate 50. The buffer layer 55 may be provided if necessary and may be omitted in some cases.

The first semiconductor layer 10 has a first major surface 60a on the side of the first semiconductor layer 10 opposite to the light emitting layer 30. The first major surface 60a is a surface facing the substrate 50. The first major surface 60a contacts the substrate major surface 50a. In this example, the first major surface 60a is a surface (the lower surface) of the buffer layer 55. However, as described above, for example, the first major surface 60a is a surface (the lower surface) of the foundation layer 60 in the case where the substrate 50 is separated from the semiconductor structural body 10s.

The semiconductor light emitting device 110 further includes a first electrode 70 and a second electrode 80. The first electrode 70 is electrically connected to the first semiconductor layer 10 (specifically, the n-side contact layer 11). The second electrode 80 is electrically connected to the second semiconductor layer 20 (specifically, the first p-side layer 21).

In this example, the light emitting layer 30 is provided between the second semiconductor layer 20 and a portion of the first semiconductor layer 10. The first electrode 70 is provided on a portion of the first semiconductor layer 10 of the major surface of the semiconductor structural body 10s on the second semiconductor layer 20 side.

Light is emitted from the light emitting layer 30 by a current flowing in the light emitting layer 30 via the first semiconductor layer 10 and the second semiconductor layer 20 by applying a voltage between the first electrode 70 and the second electrode 80. The semiconductor light emitting device 110 is, for example, an LED.

An example of the configuration of the light emitting layer 30 will now be described.

Figure 4:
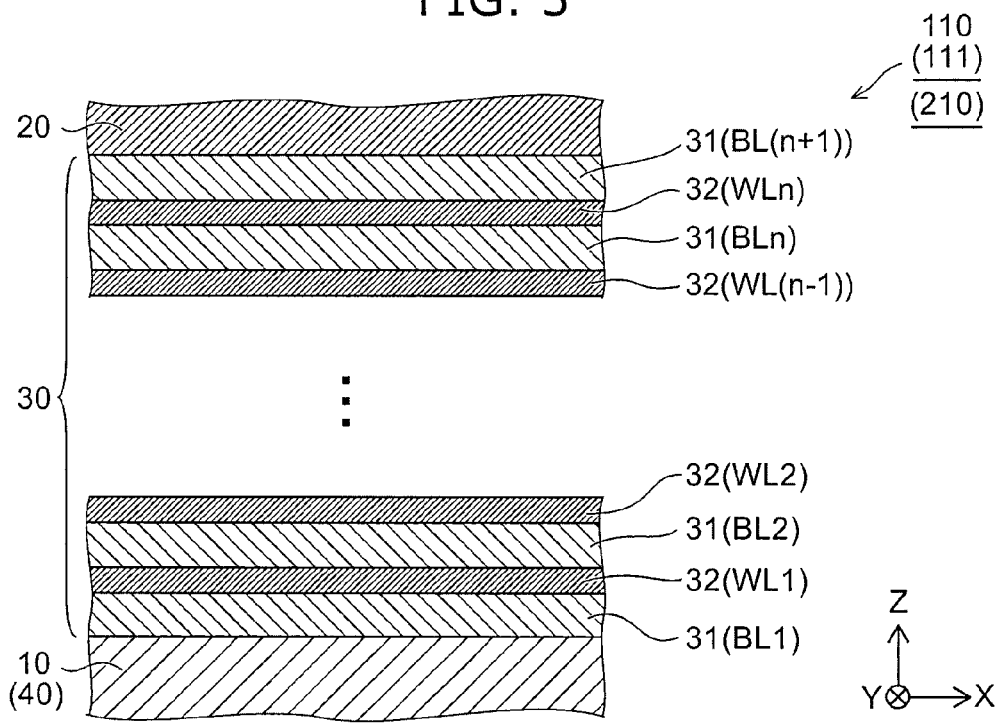
FIG. 4 is a schematic cross-sectional view illustrating a portion of the semiconductor light emitting device according to the first embodiment.

FIG. 4 is a schematic cross-sectional view illustrating the configuration of a portion of the semiconductor light emitting device according to the first embodiment.

As illustrated in FIG. 4, the light emitting layer 30 includes multiple barrier layers 31 and a well layer 32 provided between the multiple barrier layers 31.

For example, the light emitting layer 30 may have a single quantum well (SQW) structure. In such a case, the light emitting layer 30 includes two barrier layers 31 and the well layer 32 provided between the barrier layers 31. For example, the light emitting layer 30 may have a multiple quantum well (MQW) structure. In such a case, the light emitting layer 30 includes three or more barrier layers 31 and the well layers 32 provided between the barrier layers 31.

In the example illustrated in FIG. 4, the light emitting layer 30 includes n+1 barrier layers 31 and n well layers 32 (where n is an integer not less than 1). The (i+1)th barrier layer BL(i+1) is disposed between the second semiconductor layer 20 and the ith barrier layer BLi (where i is an integer not less than 1 and not more than n−1). The (i+1)th well layer WL(i+1) is disposed between the ith well layer WLi and the second semiconductor layer 20. The 1st barrier layer BL1 is provided between the first semiconductor layer 10 (in this example, the multilayered film body 40) and the 1st well layer WL1. The nth well layer WLn is provided between the nth barrier layer BLn and the (n+1)th barrier layer BL(n+1). The (n+1)th barrier layer BL(n+1) is provided between the nth well layer WLn and the second semiconductor layer 20.

The well layer 32 includes a nitride semiconductor that includes a group III element and a group V element. For example, the well layer 32 includes a nitride semiconductor that includes indium (In) and gallium (Ga). The well layer 32 includes, for example, $In_{xs}Ga_{1-xs}N$ ($0.05 \leq xs \leq 0.5$). The peak wavelength of the light emitted from the light emitting layer 30 is, for example, not less than 400 nanometers (nm) and not more than 650 nm.

The barrier layer 31 includes a nitride semiconductor that includes a group III element and a group V element. The bandgap energy of the barrier layer 31 is greater than the bandgap energy of the well layer 32. In the case where the barrier layer 31 includes In, the compositional proportion of In in the group III element of the barrier layer 31 is lower than the compositional proportion of In in the group III element of the well layer 32 (the In compositional proportion xs recited above). Thereby, the bandgap energy of the well layer 32 is less than the bandgap energy of the barrier layer 31.

The multilayered film body 40 includes multiple first films (not illustrated) stacked along the Z-axis and a second film provided between the first films. In other words, the multilayered film body 40 includes the multiple first films and the multiple second films stacked alternately in the Z-axis direction. The first film includes, for example, GaN; and the second film includes, for example, InGaN.

As illustrated in FIG. 3, an unevenness (a substrate unevenness 51) is provided in the substrate major surface 50a of the substrate 50. An unevenness (an unevenness 61) is formed in the lower surface of the semiconductor structural body 10s (the first major surface 60a of the first semiconductor layer 10) by forming the first semiconductor layer 10 on the substrate major surface 50a. The configuration of the unevenness 61 conforms to the configuration of the substrate unevenness 51.

For example, the substrate unevenness 51 of the substrate 50 has a substrate protrusion 51p, a substrate side portion 51s, and a substrate recess 51d. The substrate protrusion 51p is a portion that protrudes relatively more than does the substrate recess 51d. The substrate recess 51d is a portion that recedes relatively more than does the substrate protrusion 51p. The substrate side portion 51s is a portion between the substrate protrusion 51p and the substrate recess 51d. The substrate side portion 51s is, for example, a side surface of the substrate unevenness 51. The substrate side portion 51s has, for example, a tilted surface.

On the other hand, the unevenness 61 of the first semiconductor layer 10 has a recess 61d, a side portion 61s, and a protrusion 61p. The recess 61d is a portion that recedes relatively more than does the protrusion 61p. The protrusion 61p is a portion that protrudes relatively more than does the recess 61d. The side portion 61s is a portion between the recess 61d and the protrusion 61p. The side portion 61s is, for example, a side surface of the unevenness 61. The side portion 61s has, for example, a tilted surface.

The substrate protrusion 51p faces the recess 61d of the first semiconductor layer 10 along the Z-axis. The substrate recess 51d faces the protrusion 61p of the first semiconductor layer 10 along the Z-axis. The substrate side portion 51s faces the side portion 61s of the first semiconductor layer 10.

For example, multiple substrate protrusions 51p are formed on a flat major surface of a base body used to form the substrate 50. In such a case, for example, a continuous substrate recess 51d is made in the major surface of the base body. Or, for example, multiple substrate recesses 51d are made on the flat major surface of the base body used to form the substrate 50. In such a case, for example, a continuous substrate protrusion 51p is formed in the major surface of the base body. The multiple substrate protrusions 51p or the multiple substrate recesses 51d provided in the substrate major surface 50a are called multiple substrate structural bodies.

For example, in the case where multiple recesses 61d are provided on the flat surface of the first semiconductor layer 10, a continuous protrusion 61p is provided on the surface of the first semiconductor layer 10. Or, for example, in the case where multiple protrusions 61p are provided on the flat surface of the first semiconductor layer 10, a continuous recess 61d is provided on the surface of the first semiconductor layer 10. The multiple recesses 61d or the multiple protrusions 61p provided in the first major surface 60a are called multiple structural bodies.

Examples of the substrate structural body and the structural body will now be described.

FIG. 1 is a cross-sectional view corresponding to the cross section along line A1-A2 of FIG. 2A and the cross section along line A3-A4 of FIG. 2B. The cross section along line A1-A2 of FIG. 2A matches the cross section along line A3-A4 of FIG. 2B. FIG. 2A illustrates substrate structural bodies Sa provided in the substrate major surface 50a of the substrate 50. FIG. 2B illustrates structural bodies Sb provided in the first major surface 60a of the first semiconductor layer 10.

As illustrated in FIG. 1 and FIG. 2A, the multiple substrate structural bodies Sa are provided on the substrate major surface 50a of the substrate 50. In this example, each of the multiple substrate structural bodies Sa is the substrate protrusion 51p provided on the substrate major surface 50a. In such a case, a portion of the substrate recess 51d is provided between the multiple substrate structural bodies Sa. The embodiment is not limited thereto. As described below, each of the multiple substrate structural bodies Sa may be the substrate recess 51d. Hereinbelow, the case is described where the substrate structural body Sa is the substrate protrusion 51p.

As illustrated in FIG. 1 and FIG. 2B, the multiple structural bodies Sb are provided on the first major surface 60a of the first semiconductor layer 10 (the semiconductor structural body 10s). In this example, each of the multiple structural bodies Sb is the recess 61d provided on the first major surface 60a. In such a case, a portion of the protrusion 61p is provided between the multiple structural bodies Sb. In this example, the planar configuration of the substrate protrusion 51p is a circle and the planar configuration of the recess 61d is a circle when viewed along the Z-axis. In other words, in this example, the multiple substrate structural bodies Sa are provided on the substrate major surface 50a of the substrate 50 in circular-conic trapezoidal configurations. The embodiment is not limited thereto. The planar configuration of the substrate protrusion 51p and the planar configuration of the recess 61d are arbitrary.

As illustrated in FIG. 2A and FIG. 2B, in this example, the multiple substrate structural bodies Sa and the multiple structural bodies Sb are disposed respectively at the center and the six corners of a regular hexagon when viewed along the Z-axis. In other words, the multiple substrate protrusions 51p are disposed respectively at the center and the six corners of the regular hexagon. Also, the multiple recesses 61d of the first semiconductor layer 10 are disposed respectively at the center and the six corners of the regular hexagon. However, the disposition of the multiple substrate structural bodies Sa and the disposition of the multiple structural bodies Sb are arbitrary.

Thus, in addition to the first semiconductor layer 10, the second semiconductor layer 20, and the light emitting layer 30, the semiconductor light emitting device 60 may further include the substrate 50 contacting the first major surface 10a. The substrate 50 includes the multiple substrate structural bodies Sa conforming to the multiple structural bodies Sb.

As illustrated in FIG. 1 and FIG. 2A, the configuration of a first substrate structural body Sa1 of the multiple substrate structural bodies Sa when viewed along the Z-axis has a centroid Ca1 (a first centroid). The configuration of a second substrate structural body Sa2 of the multiple substrate structural bodies Sa nearest the first substrate structural body Sa1 when viewed along the Z-axis has a centroid Ca2 (a second centroid). The first centroid aligns with the second centroid along the second axis perpendicular to the first axis. The centroid Ca1 of the configuration of the first substrate structural body Sa1 of the multiple substrate structural bodies Sa when viewed along the Z-axis aligns along the second axis with the centroid Ca2 of the configuration of the second substrate structural body Sa2 of the multiple substrate structural bodies Sa nearest the first substrate structural body Sa1 when viewed along the Z-axis. In this example, the second axis is set to be parallel to the X-axis.

The distance along the second axis (in this example, the X-axis) between the centroid Ca1 of the first substrate structural body Sa1 and the centroid Ca2 of the second substrate structural body Sa2 is taken as a spacing Ta. The spacing Ta corresponds to the disposition pitch of the multiple substrate structural bodies Sa.

The width along the second axis (in this example, the X-axis) of a substrate apical portion 51t of the substrate protrusion 51p is taken as a substrate protrusion width ra. The width of the substrate recess 51d along the second axis is taken as a substrate recess width Ra. The width of one substrate side portion 51s along the second axis is (Ta−Ra−ra)/2.

The height of the substrate protrusion 51p is taken as a substrate protrusion height ha. The substrate protrusion height ha is the distance along the Z-axis between the Z-axis position of the substrate protrusion 51p and the Z-axis position of the substrate recess 51d.

On the other hand, as illustrated in FIG. 1 and FIG. 2B, the configuration of a first structural body Sb1 of the multiple structural bodies Sb of the first semiconductor layer 10 when viewed along the Z-axis aligns has a centroid Cb1 (a first centroid). The configuration of a second structural body Sb2 of the multiple structural bodies Sb nearest the first structural body Sb1 when viewed along the Z-axis has a centroid Cb2 (a second centroid). The first centroid aligns with the second centroid along a second axis perpendicular to the first axis. The first centroid aligns with the second centroid along a second axis perpendicular to the first axis. The centroid Cb1 of the configuration of the first structural body Sb1 of the multiple structural bodies Sb of the first semiconductor layer 10 when viewed along the Z-axis aligns along the second axis (in this example, along the X-axis) with the centroid Cb2 of the configuration of the second structural body Sb2 of the multiple structural bodies Sb nearest the first structural body Sb1 when viewed along the Z-axis.

The distance along the second axis between the centroid Cb1 of the first structural body Sb1 and the centroid Cb2 of the second structural body Sb2 is taken as a spacing Tb. The spacing Tb corresponds to the disposition pitch of the multiple structural bodies Sb.

The width of a bottom portion 61b of the recess 61d of the first semiconductor layer 10 along the second axis is taken as a recess width rb. The width of the protrusion 61p along the second axis is taken as a protrusion width Rb. The width of one side portion 61s along the second axis is (Tb−Rb−rb)/2.

The depth of the recess 61d of the first semiconductor layer 10 is taken as a recess depth hb. The recess depth hb is the distance along the Z-axis between the Z-axis position of the recess 61d and the Z-axis position of the protrusion 61p.

The spacing Tb is substantially the same as the spacing Ta. The recess width rb is substantially the same as the substrate protrusion width ra. The protrusion width Rb is substantially the same as the substrate recess width Ra. The recess depth hb is substantially the same as the substrate protrusion height ha.

The substrate protrusion height ha and the recess depth hb may be, for example, not less than about 0.5 micrometers (μm) and not more than about 3 μm. The substrate protrusion width ra and the recess width rb may be, for example, not less than 0.5 μm and not more than 4.0 μm. The substrate recess width Ra and the protrusion width Rb may be, for example, not less than 0.5 μm and not more than 4.0 μm.

In the semiconductor light emitting device 110 according to the embodiment, the substrate protrusion height ha, the substrate protrusion width ra, and the substrate recess width Ra recited above satisfy the relationships of the following first formula and second formula:

$$ra/(2 \cdot ha) \leq 0.7 \quad (1)$$

$$ra/Ra < 1 \quad (2)$$

The recess depth hb, the recess width rb, and the protrusion width Rb satisfy the relationships of the following third formula and fourth formula:

$$rb/(2 \cdot hb) \leq 0.7 \quad (3)$$

$$rb/Rb < 1 \quad (4)$$

Thereby, a semiconductor light emitting device having a high efficiency can be provided. In other words, as described below, the occurrence of pits is suppressed by satisfying the relationships recited above. Thereby, a semiconductor light emitting device having high light extraction efficiency and high crystallinity is obtained.

Experimental results that formed the basis for discovering the configuration of the embodiment recited above will now be described.

In the substrate 50 used in this experiment as illustrated in FIG. 1 and FIG. 2A, multiple substrate protrusions 51p were provided as the multiple substrate structural bodies Sa in the substrate major surface 50a of the substrate 50.

A photoresist was formed on the substrate major surface 50a of the substrate 50, which was made of c-plane sapphire. This photoresist had a repeating pattern of circles corresponding to the pattern of the substrate protrusions 51p illustrated in FIG. 2A. Subsequently, the region of the substrate major surface 50a not covered with the photoresist was etched using RIE (Reactive Ion Etching). Thereby, the multiple substrate structural bodies Sa were formed in circular-conic trapezoidal configurations on the substrate major surface 50a.

In this experiment, two types of the substrates 50 were constructed by changing the opening pattern of the photomask (and the etching conditions).

For the substrate 50 of a first sample, ra=2.3 μm, Ra=1.5 μm, ha=1.0 μm, and Ta=5 μm. For the substrate 50 of a second sample, ra=1.0 μm, Ra=2.3 μm, ha=1.0 μm, and Ta=5 μm. An undoped GaN layer was formed on each of these substrates 50. This layer corresponds to the foundation layer 60 which is a portion of the first semiconductor layer 10.

Specifically, the substrates 50 of the first sample and the second sample were processed by organic cleaning and acid cleaning; and the substrates 50 were placed inside the reaction chamber of an MOCVD system. Then, a GaN layer used to form the buffer layer 55 was formed using trimethylgallium (TMGa) and ammonia ($NH_3$). The thickness of the buffer layer 55 was about 30 nm.

Then, an undoped GaN layer used to form a portion of the foundation layer 60 was formed using TMGa and ammonia in an atmosphere including nitrogen and hydrogen at 1120° C.

The growth conditions of the GaN layers used to form the buffer layer 55 and the portion of the foundation layer 60 were the same for the first sample and the second sample. The growth process (formation state), the pits, the dislocations, and the like of the GaN layers of such samples were evaluated. In this experiment, samples of different GaN layer thicknesses were evaluated by changing the growth time of the GaN layer used to form the portion of the foundation layer 60.

FIG. 5A to FIG. 5F are electron microscope images and schematic views illustrating states of the crystal layers of the first sample and the second sample.

Figure 6:
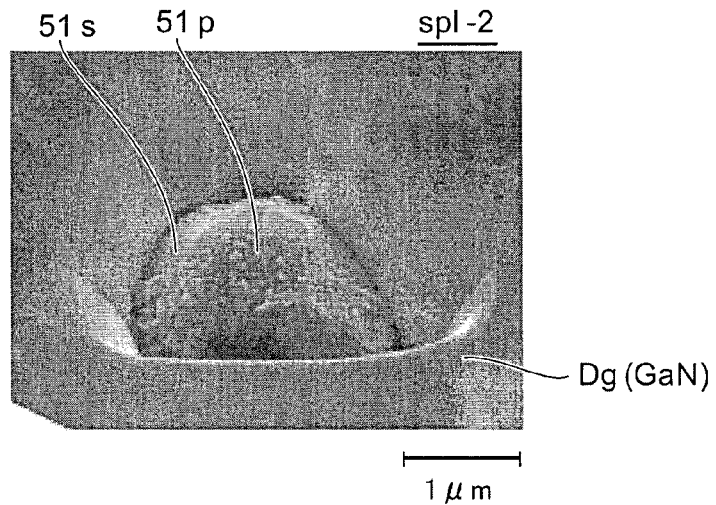
FIG. 6 is an electron microscope photograph illustrating the state of the crystal layer of the first sample.

FIG. 6 is an electron microscope photograph illustrating the state of the crystal layer of the second sample.

Figure 5A:
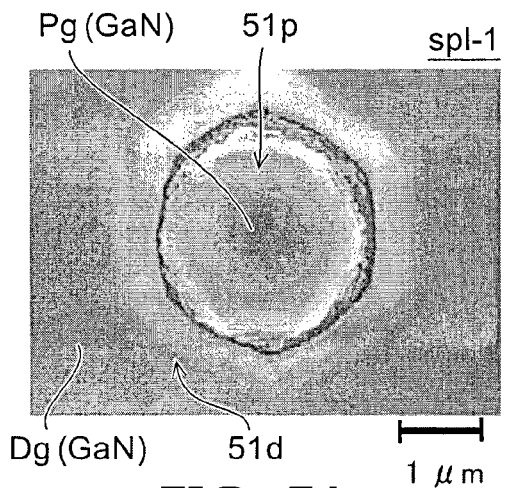
FIG. 5A to FIG. 5F are electron microscope images and schematic views illustrating states of crystal layers of a first sample and a second sample.
Figure 5D:
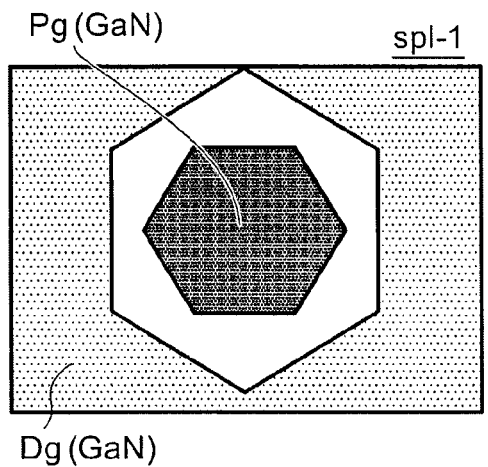
Figure 5B:
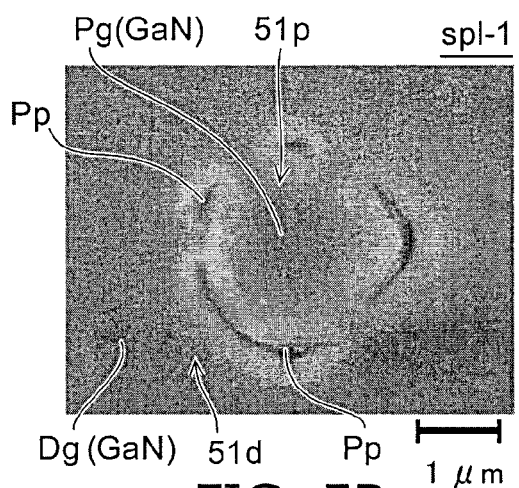
Figure 5E:
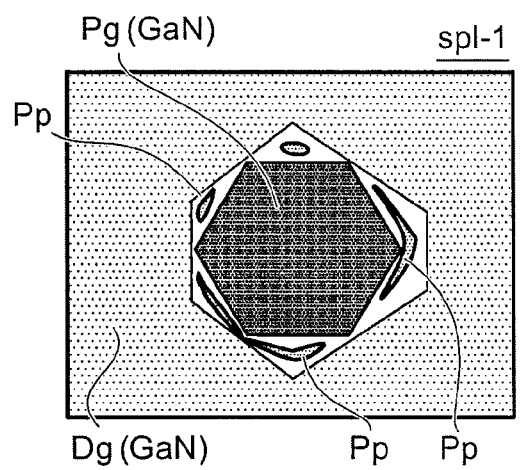
Figure 5C:
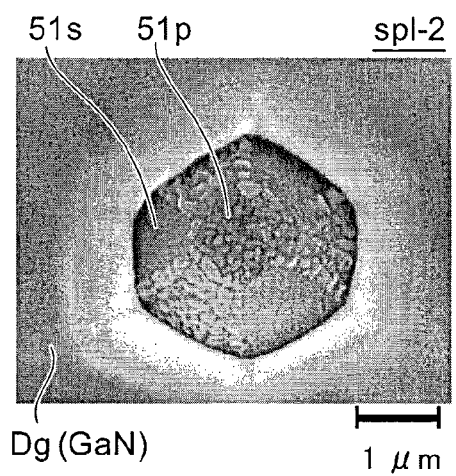

FIG. 5A to FIG. 5C are scanning electron microscope (SEM) images. These SEM images are taken from a direction substantially perpendicular to the substrate major surface 50a of the substrate 50. FIG. 5A corresponds to a growth time of 20 minutes for the GaN layer of the substrate 50 of the first sample. In other words, FIG. 5A corresponds to the average thickness of the GaN layer being about 1.0 μm. FIG. 5B corresponds to a formation time of 30 minutes for the GaN layer of the substrate 50 of the first sample. In other words, FIG. 5B corresponds to the average thickness of the GaN layer being about 1.5 μm. FIG. 5C and FIG. 6 correspond to a formation time of 20 minutes for the GaN layer of the substrate 50 of the second sample recited above. In other words, FIG. 5C and FIG. 6 correspond to the average thickness of the GaN layer being about 1.0 μm.

Figure 5F:
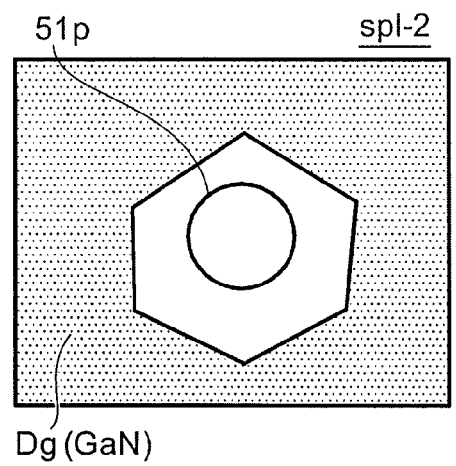

FIG. 5D to FIG. 5F are schematic plan views illustrating the states (the growth states) of the crystal layers. These drawings are drawn based on the SEM images of FIG. 5A to FIG. 5C, respectively.

FIG. 6 is a SEM image of the sample illustrated in FIG. 5C taken from a direction oblique to the substrate major surface 50a.

In the first sample spl-1 as illustrated in FIG. 5A and FIG. 5D, a crystal layer Dg (a GaN layer) grew on the substrate recess 51d; and a crystal layer Pg (a GaN layer) grew on the substrate protrusion 51p. Thus, for the first sample spl-1, the crystal of the GaN used to form the foundation layer 60 grew on both the substrate recess 51d and the substrate protrusion 51p in the initial stage of the formation of the foundation layer 60.

As illustrated in FIG. 5D, the angles of the oblique surfaces of the crystal layer Dg grown on the substrate recess 51d (the angles in a plane parallel to the substrate major surface 50a) were different from the angles of the oblique surfaces of the crystal layer Pg grown on the substrate protrusion 51p (the angles in the plane parallel to the substrate major surface 50a). In other words, the configurations of the hexagons of the crystals differed by 90 degrees around the Z-axis.

As illustrated in FIG. 5B and FIG. 5E, when the GaN layer was grown further and the thickness of the GaN layer was increased, the crystal layer Dg grown from the substrate recess 51d combined with the crystal layer Pg grown from the substrate protrusion 51p. Pits Pp were observed in the GaN layer. The pits Pp occurred at the portions where the oblique surfaces of the crystal layer Dg grown from the substrate recess 51d combined with the oblique surfaces of the crystal layer Pg grown from the substrate protrusion 51p.

On the other hand, in the substrate 50 of the second sample spl-2 as illustrated in FIG. 5C and FIG. 5F, the crystal layer Dg grew on the substrate recess 51d; but a GaN layer substantially did not grow on the substrate protrusion 51p.

It can also be seen from the SEM image of the GaN layer of the second sample spl-2 taken from the oblique direction as illustrated in FIG. 6 that the GaN layer substantially did not grow on the substrate protrusion 51p.

As the formation time of the GaN layer continued for the second sample spl-2, the crystal layer Dg grown from the substrate recess 51d combined with itself; and a flat GaN layer having no pits Pp was obtained.

Thus, it was found that the state of the crystal layer (the GaN layer) formed on the unevenness provided in the substrate 50 changes according to the configuration of the unevenness.

The experimental results recited above relating to the growth states of the GaN layers of the first sample spl-1 and the second sample spl-2 can be described as follows.

FIG. 7A to FIG. 7D are schematic cross-sectional views illustrating states of the crystal layers of the first sample and the second sample.

Figures 7A, 7B:
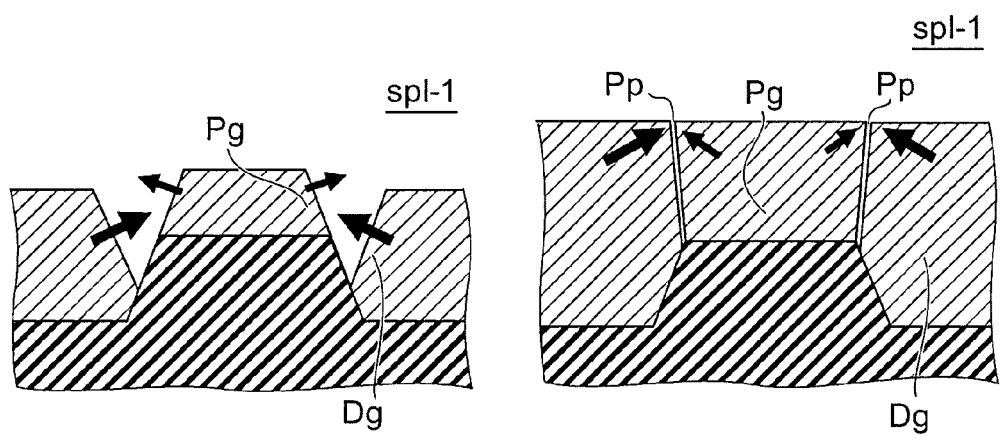
FIG. 7A to FIG. 7D are schematic cross-sectional views illustrating states of the crystal layers of the first sample and the second sample.
Figures 7C, 7D:
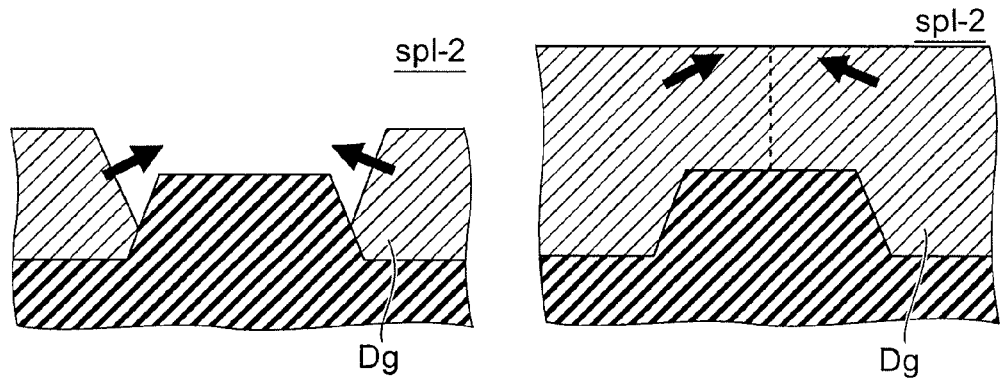

FIG. 7A to FIG. 7C correspond to the states of FIG. 5A to FIG. 5C, respectively. FIG. 7D corresponds to the state (e.g., a formation time of the GaN layer of 30 minutes) after the state of FIG. 7C.

As illustrated in FIG. 7A, the crystal layer Dg grown from the substrate recess 51d of the first sample spl-1 has an upper surface and oblique surfaces. The upper surface of the crystal layer Dg is, for example, a (0001) plane parallel to the substrate major surface 50a. The oblique surfaces of the crystal layer Dg are crystal planes equivalent to a (11-22) plane and a (11-22) plane.

The crystal layer Pg grown from the substrate protrusion 51p also has an upper surface and oblique surfaces. In such a case as well, the upper surface of the crystal layer Pg is, for example, the (0001) plane parallel to the substrate major surface 50a. On the other hand, the oblique surfaces of the crystal layer Pg are crystal planes equivalent to a (10-11) plane and a (10-11) plane.

Thus, the plane orientations of the oblique surfaces of the crystal layer Dg grown from the substrate recess 51d are different from the plane orientations of the oblique surfaces of the crystal layer Pg grown from the substrate protrusion 51p. In other words, the oblique surfaces of the crystal layer Dg grown from the substrate recess 51d are rotated 90 degrees around the Z-axis from the oblique surfaces of the crystal layer Pg grown from the substrate protrusion 51p. This state is observed in FIG. 5A.

Therefore, as illustrated in FIG. 5D, the configuration of the hexagon formed by these oblique surfaces differs by 90 degrees between the crystal layer Dg grown from the substrate recess 51d and the crystal layer Pg grown from the substrate protrusion 51p when viewed along the Z-axis.

Then, when the GaN layer is grown further as illustrated in FIG. 7B, the crystal layer Dg grown from the substrate recess 51d combines with the crystal layer Pg grown from the substrate protrusion 51p. At this time, the pits Pp occur at the portions where these oblique surfaces combine because the plane orientations are different between the oblique surfaces of the crystal layer Dg (e.g., the (11-22) planes) and the oblique surfaces of the crystal layer Pg (e.g., the (10-11) planes). The pits Pp extend along the crystal planes equivalent to the (1-101) plane and the (1-101) plane of the GaN layer. In other words, the pits Pp occur parallel to the <11-20> axis (i.e., the a-axis) of the GaN layer. Thus, when the foundation layer 60 is formed by increasing the thickness of the GaN layer in the first sample spl-1, the pits Pp remain in portions; and a flat foundation layer 60 is not obtained.

On the other hand, in the second sample spl-2 as illustrated in FIG. 7C, the crystal layer Dg grows on the substrate recess 51d; but a GaN layer substantially does not grow on the substrate protrusion 51p. In other words, mainly a GaN layer having oblique surfaces of the (11-22) plane grows.

Therefore, when the thickness of the GaN layer is increased as illustrated in FIG. 7D, the substrate protrusion 51p is covered with the GaN layer (the crystal layer Dg). Therefore, the pits Pp do not occur easily. Thus, a flat GaN layer is formed in which the occurrence of the pits Pp on the substrate 50 of the second sample spl-2 is suppressed.

It was also seen that the GaN layer had irregular growth from the oblique surface (the substrate side portion 51s) of the substrate unevenness 51 in the first sample spl-1.

Figures 8, 9:
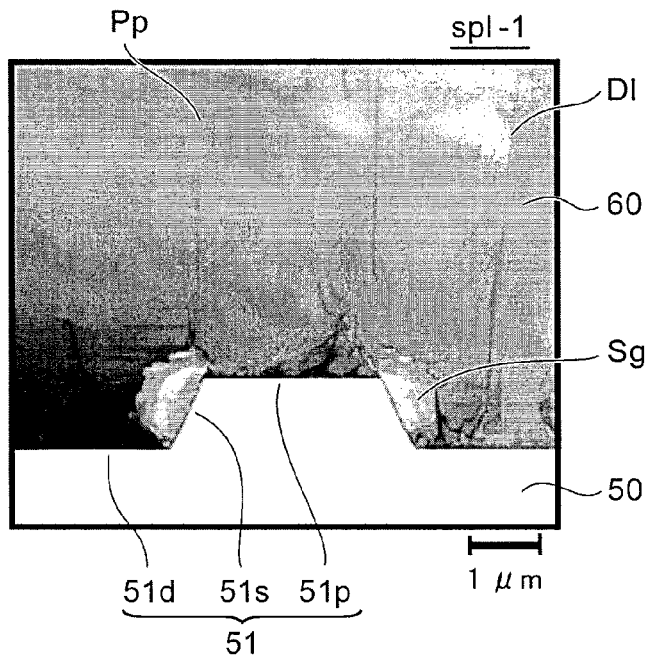
FIG. 8 is a cross section scanning electron microscope photograph illustrating the state of the crystal layer of the first sample.
FIG. 9 is a table illustrating the configurations of the substrates used in the experiment and the characteristics of the crystal layers grown on the substrates.

FIG. 8 is a cross section scanning electron microscope photograph illustrating the state of the crystal layer of the first sample.

This photograph is a cross section transmission electron microscope (TEM) image of the GaN layer (corresponding to the foundation layer 60) grown on the substrate 50 of the first sample spl-1.

In the GaN layer (the foundation layer 60) grown on the substrate 50 of the first sample spl-1 as illustrated in FIG. 8, other than the pits Pp, an oblique surface irregular growth layer Sg grown from the oblique surface (the substrate side portion 51s) of the substrate unevenness 51 was observed. Many dislocations DI also were observed in this sample (the black lines in the image of FIG. 8 corresponding to the dislocations DI). The pits Pp, the oblique surface irregular growth layer Sg, and the dislocations DI reduce the crystallinity of the n-side contact layer 11, the light emitting layer 30, and the second semiconductor layer 20 formed on the foundation layer 60 and, as a result, reduce the efficiency of the semiconductor light emitting device.

On the other hand, the oblique surface irregular growth layer Sg that grows from the oblique surface (the substrate side portion 51s) of the substrate unevenness 51 was not observed for the GaN layer grown on the substrate 50 of the second sample spl-2. Also, the number of the dislocations DI was extremely low.

Thus, the inventor experimentally discovered that the state of the pits Pp, the oblique surface irregular growth layer Sg, and the dislocations DI occurring in the GaN layer grown on the substrate unevenness 51 provided in the substrate 50 change according to the configuration (the relationship between the dimensions of the substrate protrusion 51p and the dimensions of the substrate recess 51d) of the substrate unevenness 51.

Based on this knowledge, the inventor further constructed the substrates 50 having multiple substrate structural bodies Sa of various dimensions and various configurations. In other words, the multiple substrate structural bodies Sa having various dimensions and various configurations were formed by patterning a base body used to form the substrate 50 by changing the opening pattern of the photomask and the etching conditions.

FIG. 9 is a table illustrating the configurations of the substrates and the characteristics of the crystal layers grown on the substrates used in the experiment.

The first sample spl-1 and the second sample spl-2 described above also are illustrated in this table.

In this experiment as illustrated in FIG. 9, the substrate 50 having the substrate unevenness 51 also was constructed for a third sample spl-3 to a seventh sample spl-7. The table illustrates the substrate protrusion width ra (i.e., the recess width rb), the substrate recess width Ra (i.e., the protrusion width Rb), the substrate protrusion height ha (i.e., the recess depth hb), and the spacing Ta (i.e., the spacing Tb) of the samples. The buffer layer 55 (the GaN layer) was formed on each of these substrates 50; and an undoped GaN layer used to form the foundation layer 60 was formed on the buffer layer 55. The formation conditions of these layers were the same as those described in regard to the first sample spl-1 and the second sample spl-2.

Then, SEM images were taken for the GaN layers that were obtained; and the growth states of the GaN layers were evaluated. In particular, attention was given to the crystal layer Pg grown from the substrate protrusion 51p and the oblique surface irregular growth layer Sg grown from the oblique surface of the substrate unevenness 51 (the substrate side portion 51s) in the initial growth of the GaN layer.

FIG. 9 illustrates the evaluation results of the growth/nongrowth of the crystal layer Pg grown from the substrate protrusion 51p and the growth/nongrowth of the oblique surface irregular growth layer Sg.

The crystal layer Pg grown from the substrate protrusion 51p was observed for the first sample spl-1 and the fifth sample spl-5 to the seventh sample spl-7 as illustrated in FIG. 9. Conversely, the crystal layer Pg grown from the substrate protrusion 51p was not observed for the second sample spl-2 to the fourth sample spl-4.

It is conceivable that whether or not the GaN layer grows from the substrate protrusion 51p depends on the relative relationship between the width of the substrate protrusion 51p (the substrate protrusion width ra) and the height of the substrate protrusion 51p (the substrate protrusion height ha). In other words, it is conceivable that the GaN layer does not grow easily on the substrate protrusion 51p when the width of the substrate protrusion 51p is sufficiently less than the height of the substrate protrusion 51p. The relationship between ra/2 and ha was investigated.

As illustrated in FIG. 9, the crystal layer Pg does not grow on the substrate protrusion 51p when ra/(2·ha) is 0.5. On the other hand, the crystal layer Pg grows on the substrate protrusion 51p when ra/(2·ha) is 1.15. It was found that there are cases where the crystal layer Pg grows and does not grow on the substrate protrusion 51p when ra/(2·ha) is 0.65 and 0.70.

Further, it is conceivable that whether or not the GaN layer grows from the substrate protrusion 51p depends on the relative relationship between the width of the substrate protrusion 51p (the substrate protrusion width ra) and the width of the substrate recess 51d (the substrate recess width Ra). In other words, it is conceivable that the GaN layer grows less easily on the substrate protrusion 51p because the source-material gas is preferentially supplied to the substrate recess 51d by vapor phase diffusion and surface diffusion when the width of the substrate protrusion 51p (the substrate protrusion width ra) is sufficiently narrow.

As illustrated in FIG. 9, ra/Ra is less than 1 for the second sample spl-2 to the fourth sample spl-4. Also, ra/Ra is not less than 1 in the first sample spl-1 and the fifth sample spl-5 to the seventh sample spl-7. Therefore, it can be seen that the growth of the crystal layer Pg on the substrate protrusion 51p is suppressed when ra/Ra is less than 1, that is, when the width of the substrate protrusion 51p is narrower than the width of the substrate recess 51d.

From the description recited above, in the semiconductor light emitting device 110 according to the embodiment, the substrate protrusion height ha, the substrate protrusion width ra, and the substrate recess width Ra are set to satisfy the relationships $$ra/(2 \cdot ha) \leq 0.7 \quad (1)$$

$$ra/Ra < 1 \quad (2)$$

The recess depth hb, the recess width rb, and the protrusion width Rb are set to satisfy the relationships $$rb/(2 \cdot hb) \leq 0.7 \quad (3)$$

$$rb/Rb < 1 \quad (4)$$

Thereby, the growth of the crystal layer Pg on the substrate protrusion 51p is suppressed. Also, the occurrence of the pits Pp as the crystal layer Pg grows is suppressed. Thereby, a semiconductor light emitting device having a high efficiency can be provided. In other words, a semiconductor light emitting device that realizes high light extraction efficiency and high crystallinity is obtained.

It is more desirable for ra/(2·ha) to be not less than 0.4 and not more than 0.7.

It is more desirable for ra/Ra to be not less than 0.25 and not more than 0.6.

It is more desirable for rb/(2·hb) to be not less than 0.4 and not more than 0.7.

It is more desirable for rb/Rb to be not less than 0.25 and not more than 0.6.

In the case where the pits Pp exist, there are cases where current leaks through the pits Pp and the reliability of the semiconductor light emitting device decreases. In the embodiment, high reliability is obtained in addition to high efficiency because the occurrence of the pits Pp is suppressed.

It is conceivable that whether or not the GaN layer grows from the substrate protrusion 51p depends also on the relative relationship between the surface area of the substrate protrusion 51p and the surface area of the substrate recess 51d in the substrate major surface 50a. In other words, it is conceivable that the GaN layer does not grow easily on the substrate protrusion 51p when the surface area of the substrate protrusion 51p is sufficiently small with respect to the surface area of the substrate recess 51d. Here, the total of the surface area of the substrate protrusion 51p, the surface area of the substrate recess 51d, and the surface area of the substrate side portion 51s is taken to be the surface area of the substrate major surface 50a when viewed along the Z-axis.

FIG. 9 illustrates a ratio Sr of the total surface area of the substrate apical portion 51t per unit surface area of the substrate major surface 50a to the total surface area of the substrate recess 51d per the unit surface area for the first sample spl-1 to the seventh sample spl-7. It can be seen from FIG. 9 that the ratio Sr is not less than 0.17 for the first sample spl-1 and the fifth sample spl-5 to the seventh sample spl-7. The ratio Sr is less than 0.17 for the second sample spl-2 to the fourth sample spl-4. Therefore, it is desirable for the ratio Sr to be less than 0.17, and more desirably, not more than 0.11.

Thereby, the growth of the crystal layer Pg on the substrate protrusion 51p is suppressed; and the occurrence of the pits Pp is drastically suppressed.

In the first semiconductor layer 10 (e.g., the foundation layer 60), it is desirable for the ratio (corresponding to Sr recited above) of the total surface area of the bottom portion 61b of the recess 61d per unit surface area of the first major surface 60a to the total surface area of the protrusion 61p per the unit surface area to be less than 0.17, and more desirably, not more than 0.11.

As illustrated in FIG. 9, the oblique surface irregular growth layer Sg was observed for the first sample spl-1, the fifth sample spl-5, and the seventh sample spl-7. On the other hand, the oblique surface irregular growth layer Sg was not observed for the second sample spl-2 to the fourth sample spl-4 and the sixth sample spl-6.

It is conceivable that whether or not the oblique surface irregular growth layer Sg forms depends on the configuration of the tilted surface of the substrate side portion 51s. In other words, it is conceivable that the occurrence of the oblique surface irregular growth layer Sg is suppressed when the tilt of the oblique surface is gradual.

The relationship between the width of the substrate side portion 51s and the substrate protrusion height ha of the substrate protrusion 51p was investigated regarding the tilt of the oblique surface. The width of one substrate side portion 51s is (Ta−Ra−ra)/2.

FIG. 9 illustrates the values of ha/(Ta−Ra−ra). It can be seen from FIG. 9 that the oblique surface irregular growth layer Sg was not observed when ha/(Ta−Ra−ra) was not more than 0.59.

It is considered that the oblique surface irregular growth layer Sg is the GaN layer growing from the (11-23) plane (i.e., the n-plane) of the sapphire substrate. The (11-23) plane (i.e., the n-plane) of the sapphire substrate is a major crystal plane of the oblique surface (the substrate side portion 51s) in the case where ha/(Ta−Ra−ra) is 0.65 to 0.8. In such a case, the oblique surface irregular growth layer Sg forms easily. Accordingly, it is conceivable that the growth of the GaN layer on the oblique surface (the substrate side portion 51s) is suppressed by ha/(Ta−Ra−ra) being not more than 0.6, that is, by suppressing the formation of the (11-23) plane of the sapphire substrate. This matches the experimental results illustrated in FIG. 9.

Thus, in the substrate 50, it is favorable for ha/(Ta−Ra−ra) to be not more than 0.6. In other words, it is favorable for hb/(Tb−Rb−rb) of the first semiconductor layer 10 (the foundation layer 60) to be not more than 0.6. Thereby, the formation of the oblique surface irregular growth layer Sg is suppressed; and a crystal having a low dislocation density and high quality is obtained. Thereby, a high efficiency is obtained. It is more favorable for ha/(Ta−Ra−ra) to be not more than 0.5. It is more favorable for hb/(Tb−Rb−rb) of the first semiconductor layer 10 (the foundation layer 60) to be not more than 0.5.

ha/(Ta−Ra−ra) and hb/(Tb−Rb−rb) are set to be not less than 0. In other words, the oblique surfaces of the substrate unevenness 51 have forward tapers.

In the embodiment, it is favorable for the substrate protrusion height ha and the recess depth hb of the recess 61d of the first semiconductor layer 10 to be larger than the peak wavelength of the light emitted from the light emitting layer 30. Thereby, for example, the light extraction efficiency can be increased due to the diffraction effect of the light.

The surface flatness degrades in the case where the substrate protrusion height ha and the recess depth hb are too large. It is favorable for the substrate protrusion height ha and the recess depth hb to be, for example, not more than the substrate recess width Ra (the protrusion width Rb). Thereby, high surface flatness is obtained.

In the embodiment, for example, the substrate apical portion 51t of the substrate protrusion 51p has a portion parallel to the substrate major surface 50a. The recess 61d of the first semiconductor layer 10 has a portion parallel to the first major surface 60a.

For example, there are cases where the circumferential edge portion of the substrate protrusion 51p is rounded when the substrate 50 is cut by a plane including the Z-axis. Also, there are cases where the circumferential edge portion of the substrate recess 51d is rounded.

In such cases, for example, the substrate protrusion 51p, the substrate recess 51d, and the substrate side portion 51s can be defined as follows for convenience. Namely, the substrate protrusion 51p may be taken to be, for example, the portion from the most protruding portion of the substrate unevenness 51 to the distance of 10% of the substrate protrusion height ha from the most protruding portion of the substrate unevenness 51. The substrate recess 51d may be taken to be, for example, the portion from the most receding portion of the substrate unevenness 51 to the distance of 10% of the substrate protrusion height ha from the most receding portion of the substrate unevenness 51. The substrate side portion 51s may be taken to be the portion of the substrate unevenness 51 other than the substrate protrusion 51p and the substrate recess 51d (the portion of 80% of the substrate protrusion height ha).

Similarly, the recess 61d, the protrusion 61p, and the side portion 61s of the first semiconductor layer 10 can be defined as follows for convenience. Namely, the recess 61d may be taken to be, for example, the portion from the most receding portion of the unevenness 61 to the distance of 10% of the recess depth hb from the most receding portion of the unevenness 61. The protrusion 61p may be taken to be, for example, the portion from the most protruding portion of the unevenness 61 to the distance of 10% of the recess depth hb from the most protruding portion of the unevenness 61. The side portion 61s may be taken to be the portion of the unevenness 61 other than the protrusion 61p and the recess 61d (the portion of 80% of the recess depth hb).

Example

A semiconductor light emitting device according to an example of the embodiment will now be described. The semiconductor light emitting device 111 of the example had the configuration described in regard to the semiconductor light emitting device 110 as illustrated in FIG. 1, FIG. 2A, FIG. 2B, FIG. 3, and FIG. 4. The semiconductor light emitting device 111 was formed on the substrate 50 of the second sample spl-2.

The method for manufacturing the semiconductor light emitting device 111 will now be described. This manufacturing method is one example of the method for manufacturing the semiconductor light emitting device of the embodiment.

The substrate 50 having the configuration of the second sample spl-2 was processed by organic cleaning and acid cleaning. A GaN layer used to form the buffer layer 55 was formed using TMGa and $NH_3$ in an MOCVD apparatus. The thickness of the buffer layer 55 was, for example, about 30 nm.

Then, an undoped GaN layer used to form the foundation layer 60 was formed using TMGa and ammonia in an atmosphere including nitrogen and hydrogen at 1120° C. The thickness of the foundation layer 60 was, for example, about 3 μm.

An n-type GaN layer used to form the n-side contact layer 11 was formed by adding silane (SiH$_4$) as an impurity source-material gas. The thickness of the n-side contact layer 11 was, for example, about 4 μm.

The multilayered film body 40 was formed on the n-side contact layer 11. Specifically, an undoped GaN film used to form a first film was formed using TMGa and ammonia in a nitrogen atmosphere. The growth temperature of the first film was, for example, about 800° C. The thickness of the first film was, for example, about 3 nm. An undoped In$_{0.07}$Ga$_{0.93}$N film used to form a second film was formed on the first film by adding trimethylindium (TMIn). The formation temperature of the second film was, for example, about 800° C. The thickness of the second film was, for example, about 1 nm. The formation of the first film and the formation of the second film was repeated a total of 20 times. Then, the first film was formed on the final second film. Thereby, the multilayered film body 40 was formed.

Then, an undoped GaN layer used to form the barrier layer 31 was formed using TMGa and ammonia in a nitrogen atmosphere with the temperature of the substrate 50 at, for example, about 850° C. The thickness of the barrier layer 31 was, for example, about 5 nm. Continuing, an undoped In$_{0.15}$Ga$_{0.85}$N layer used to form the well layer 32 was formed using TMGa, TMIn, and ammonia with the temperature of the substrate 50 at, for example, about 730° C. The thickness of the well layer 32 was, for example, about 2.5 nm. Then, the light emitting layer 30 was formed by repeatedly implementing the formation of the barrier layer 31 and the formation of the well layer 32 recited above. The number of the well layers 32 (the number of stacks) was eight.

Continuing, an AlGaN layer used to form the third p-side layer 23 was formed using TMA trimethylaluminum (TMAl), TMGa, and ammonia and using bis(cyclopentadienyl)magnesium (Cp$_2$Mg) as an impurity source material in an atmosphere including nitrogen and hydrogen at, for example, about 1030° C. Then, a p-type GaN layer used to form the second p-side layer 22 was formed using TMGa and ammonia; and a p-type GaN layer used to form the first p-side layer 21 was formed on the p-type GaN layer that was used to form the second p-side layer 22. The thickness of the third p-side layer 23 was, for example, 10 nm; the thickness of the second p-side layer 22 was, for example, 80 nm; and the thickness of the first p-side layer 21 was, for example, 10 nm. Thereby, the semiconductor structural body 10s was formed.

Subsequently, the temperature of the substrate 50 was reduced to room temperature. Then, a portion of the second semiconductor layer 20 and a portion of the light emitting layer 30 were removed by performing dry etching from the major surface of the semiconductor structural body 10s on the second semiconductor layer 20 side to reach a thickness partway through the n-side contact layer 11. Thereby, a portion of the first semiconductor layer 10 (the n-side contact layer 11) was exposed. The first electrode 70 having a stacked film of a Ti film/Pt film/Au film was formed on the n-side contact layer 11 that was exposed. An ITO layer used to form the second electrode 80 was formed on the first p-side layer 21. Thereby, the semiconductor light emitting device 111 was formed.

Then, as a reference example, a semiconductor light emitting device 191 was formed on the substrate 50 of the first sample spl-1 using conditions similar to those of the semiconductor light emitting device 111.

Figure 10:
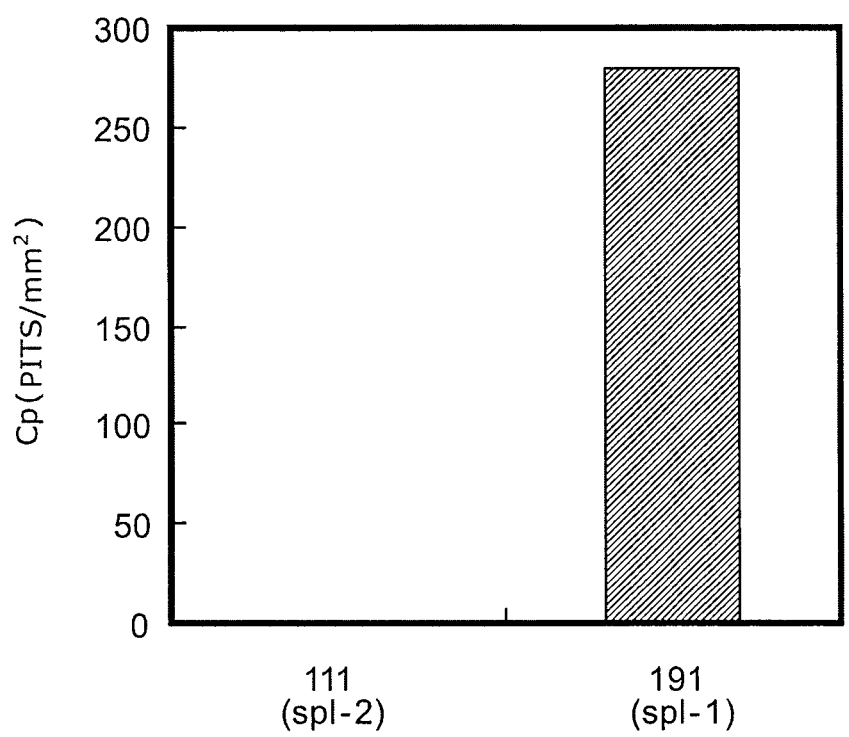
FIG. 10, FIG. 11A, and FIG. 11B are graphs illustrating the characteristics of the semiconductor light emitting devices of the example and the reference example.
Figure 11A:
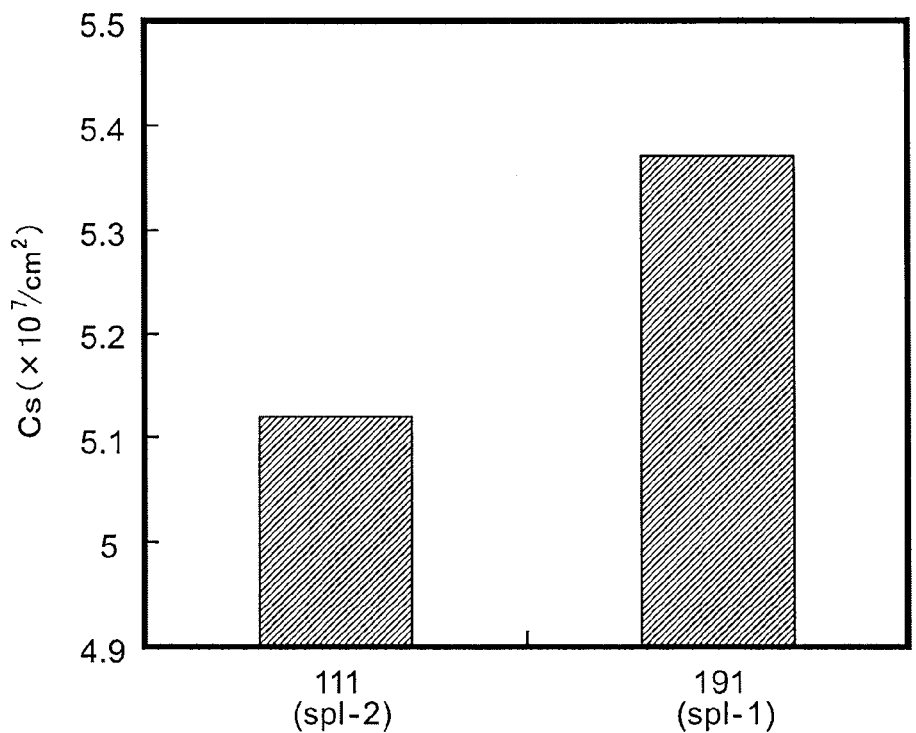
Figure 11B:
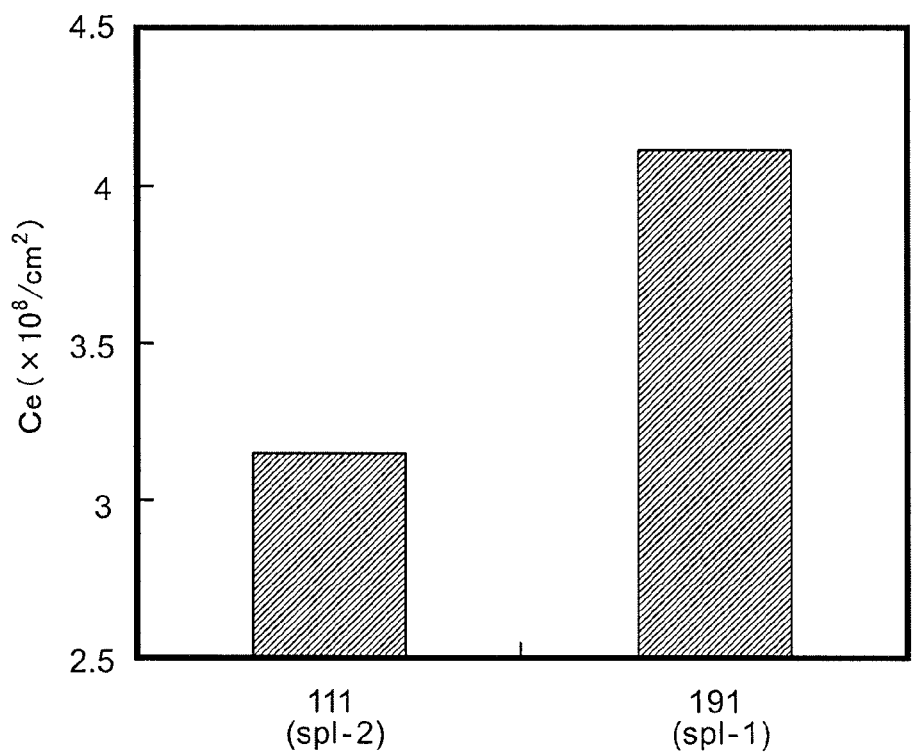

FIG. 10, FIG. 11A, and FIG. 11B are graphs illustrating characteristics of the semiconductor light emitting devices of the example and the reference example.

The vertical axis of FIG. 10 is a pit density Cp; the vertical axis of FIG. 11A is a screw dislocation density Cs; and the vertical axis of FIG. 11B is an edge dislocation density Ce. The pit density Cp was determined from SEM images. The screw dislocation density Cs and the edge dislocation density Ce were determined from TEM images.

As illustrated in FIG. 10, the pit density Cp was about 280 pits/mm$^2$ for the semiconductor light emitting device 191 of the reference example. In contrast, for the semiconductor light emitting device 111 of the reference example, no pits Pp were observed; and the pit density Cp was 0 pits/mm$^2$.

As illustrated in FIG. 11A, although the screw dislocation density Cs of the semiconductor light emitting device 191 was about $5.4 \times 10^7$/mm$^2$, the screw dislocation density Cs of the semiconductor light emitting device 111 was about $5.1 \times 10^7$/mm$^2$. As illustrated in FIG. 11B, although the edge dislocation density Ce of the semiconductor light emitting device 191 was about $4.1 \times 10^8$/mm$^2$, the edge dislocation density Ce of the semiconductor light emitting device 111 was about $3.2 \times 10^8$/mm$^2$.

Thus, the pit density Cp, the screw dislocation density Cs, and the edge dislocation density Ce were lower for the semiconductor light emitting device 111 of the example than for the semiconductor light emitting device 191 of the reference example.

In the semiconductor light emitting device 111, the growth of the crystal layer Pg from the substrate protrusion 51p was suppressed. Thereby, the occurrence of the pits Pp was suppressed. Also, the dislocation density of the entirety decreased because dislocations substantially did not occur on the substrate protrusion 51p.

In the semiconductor light emitting device 191 of the reference example, the oblique surface irregular growth layer Sg was observed; and dislocations occurred from the oblique surface irregular growth layer Sg. In contrast, in the semiconductor light emitting device 111, the oblique surface irregular growth layer Sg was not observed. In the semiconductor light emitting device 111, it is conceivable that the dislocation density decreased because the occurrence of defects in the substrate protrusion 51p and the substrate side portion 51s were suppressed.

Measuring the light emission characteristics of the semiconductor light emitting devices 111 and 191 showed that the light output of the semiconductor light emitting device 111 was about 1.05 times the light output of the semiconductor light emitting device 191.

Figure 12:
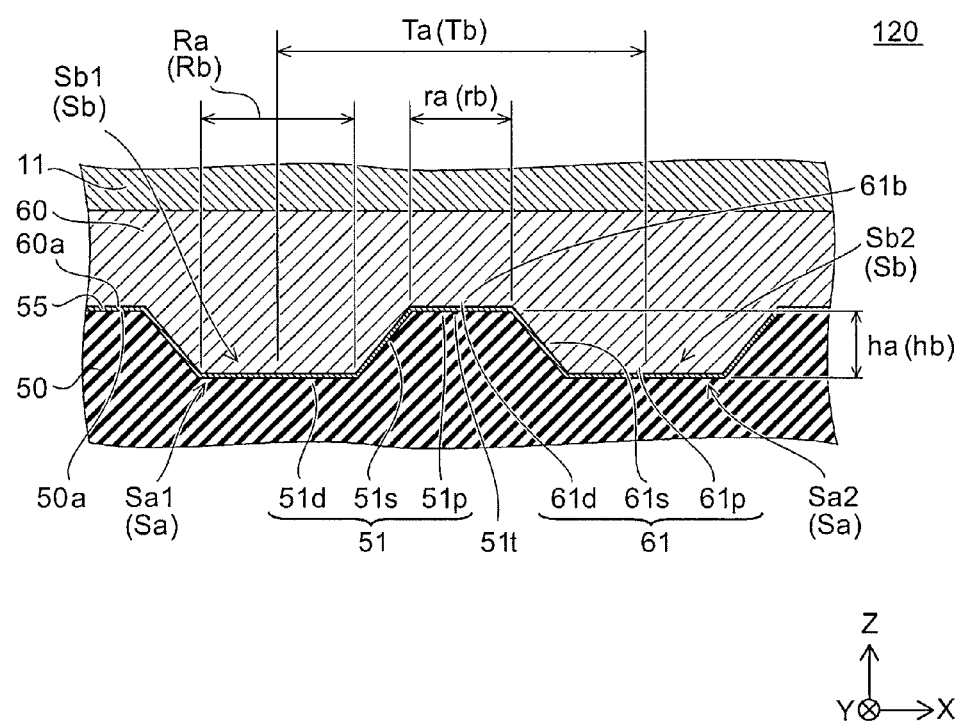
FIG. 12 is a schematic cross-sectional view illustrating the configuration of another semiconductor light emitting device according to the first embodiment.

FIG. 12 is a schematic cross-sectional view illustrating the configuration of another semiconductor light emitting device according to the first embodiment.

Figure 13A:
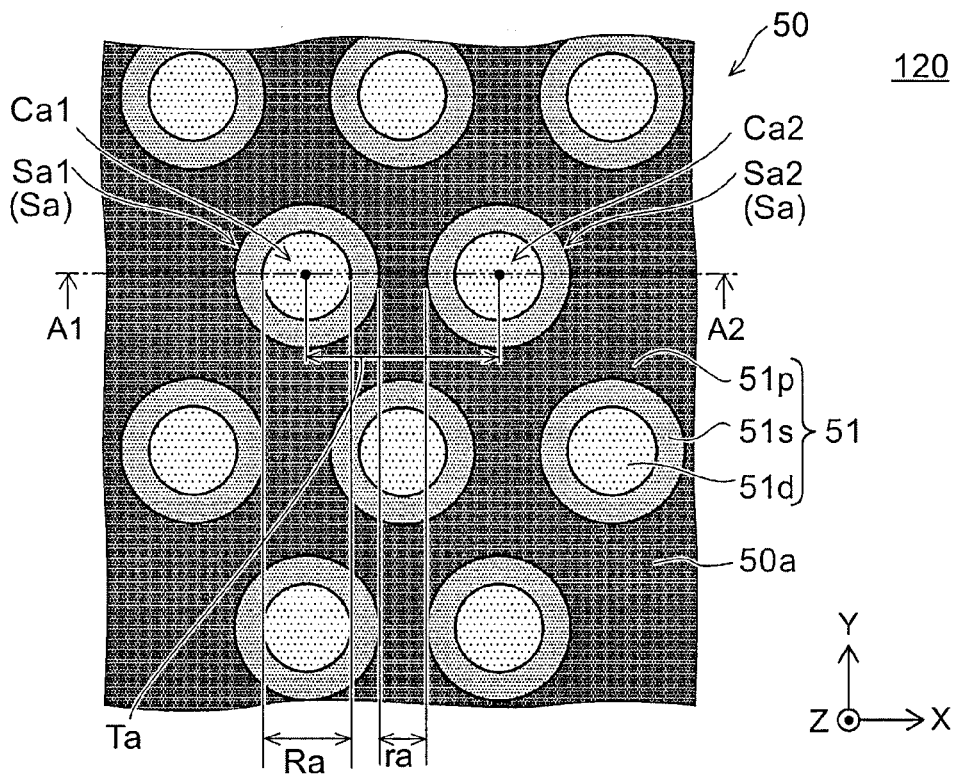
FIG. 13A and FIG. 13B are schematic plan views illustrating another semiconductor light emitting device according to the first embodiment.
Figure 13B:
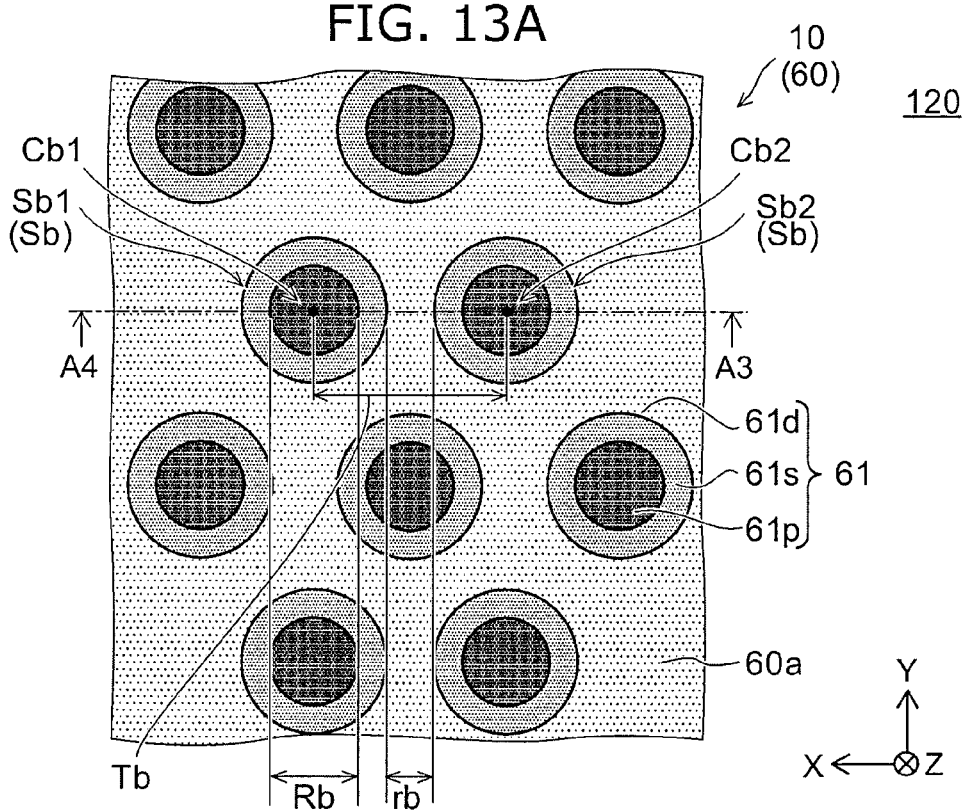

FIG. 13A and FIG. 13B are schematic plan views illustrating the configuration of another semiconductor light emitting device according to the first embodiment.

FIG. 12 is a cross-sectional view corresponding to the cross section along line A1-A2 of FIG. 13A and the cross section along line A3-A4 of FIG. 13B. The cross section along line A1-A2 of FIG. 13A matches the cross section along line A3-A4 of FIG. 13B. FIG. 13A illustrates the substrate structural bodies Sa provided in the substrate major surface 50a of the substrate 50. FIG. 13B illustrates the structural bodies Sb provided in the first major surface 60a of the first semiconductor layer 10.

In the semiconductor light emitting device 120 according to the embodiment as illustrated in FIG. 12 and FIG. 13A, each of the multiple substrate structural bodies Sa is the substrate recess 51d provided on the substrate major surface 50a. In such a case, a portion of the substrate protrusion 51p is provided between the multiple substrate structural bodies Sa.

As illustrated in FIG. 12 and FIG. 13B, in this example, each of the multiple structural bodies Sb is the protrusion 61p provided on the first major surface 60a. In such a case, a portion of the recess 61d is provided between the multiple structural bodies Sb.

In this example, the planar configuration of the substrate recess 51d is a circle and the planar configuration of the protrusion 61p is a circle when viewed along the Z-axis. In other words, in this example, the multiple substrate structural bodies Sa are provided as holes having circular-conic trapezoidal configurations on the substrate major surface 50a of the substrate 50. The embodiment is not limited thereto. The planar configuration of the substrate recess 51d and the planar configuration of the protrusion 61p are arbitrary.

As illustrated in FIG. 13A and FIG. 13B, in this example as well, the multiple substrate structural bodies Sa and the multiple structural bodies Sb are disposed respectively at the center and the six corners of a regular hexagon when viewed along the Z-axis. However, the disposition of the multiple substrate structural bodies Sa and the disposition of the multiple structural bodies Sb are arbitrary.

As illustrated in FIG. 12 and FIG. 13A, in this example as well, the centroid Ca1 of the configuration of the first substrate structural body Sa1 of the multiple substrate structural bodies Sa when viewed along the Z-axis aligns along the second axis with the centroid Ca2 of the configuration of the second substrate structural body Sa2 of the multiple substrate structural bodies Sa nearest the first substrate structural body Sa1 when viewed along the Z-axis.

In this example as well, the distance along the second axis (in this example, the X-axis) between the centroid Ca1 of the first substrate structural body Sa1 and the centroid Ca2 of the second substrate structural body Sa2 is taken as the spacing Ta.

The width of the substrate apical portion 51t of the substrate protrusion 51p along the second axis is taken as the substrate protrusion width ra. The width of the substrate recess 51d along the second axis is taken as the substrate recess width Ra. The width of one substrate side portion 51s along the second axis is (Ta−Ra−ra)/2. The height of the substrate protrusion 51p is taken as the substrate protrusion height ha.

As illustrated in FIG. 12 and FIG. 13B, the centroid Cb1 of the configuration of the first structural body Sb1 of the multiple structural bodies Sb of the first semiconductor layer 10 when viewed along the Z-axis aligns along the second axis with the centroid Cb2 of the configuration of the second structural body Sb2 of the multiple structural bodies Sb nearest the first structural body Sb1 when viewed along the Z-axis.

The distance along the second axis between the centroid Cb1 of the first structural body Sb1 and the centroid Cb2 of the second structural body Sb2 is taken as the spacing Tb. The width of the bottom portion 61b of the recess 61d of the first semiconductor layer 10 along the second axis is taken as the recess width rb. The width of the protrusion 61p along the second axis is taken as the protrusion width Rb. The width of one side portion 61s along the second axis is (Tb−Rb−rb)/2. The depth of the recess 61d of the first semiconductor layer 10 is taken as the recess depth hb.

The substrate protrusion height ha and the recess depth hb may be, for example, not less than about 0.5 µm and not more than about 3.0 µm. The substrate protrusion width ra and the recess width rb may be, for example, not less than 0.5 µm and not more than 4.0 µm. The substrate recess width Ra and the protrusion width Rb may be, for example, not less than 0.5 µm and not more than 4.0 µm.

In the semiconductor light emitting device 120 as well, the substrate protrusion height ha, the substrate protrusion width ra, the substrate recess width Ra, the recess depth hb, the recess width rb, and the protrusion width Rb are set to satisfy the first formula to the fourth formula recited above. Thereby, the occurrence of pits can be suppressed; and a semiconductor light emitting device having a high efficiency can be provided.

Thus, in the embodiment, the relationship between the dimensions of the substrate protrusion 51p and the dimensions of the substrate recess 51d is set appropriately for the multiple substrate structural bodies Sa provided in the substrate 50. In other words, the relationship between the dimensions of the recess 61d and the dimensions of the protrusion 61p is set appropriately for the first semiconductor layer 10. Thereby, the growth of the crystal layer Pg on the substrate protrusion 51p is suppressed. Thereby, the pit density Cp can be reduced; and the dislocation density can be reduced.

In the reference example in which the plane orientation of the substrate unevenness 51 was set to be in the prescribed direction, the suppression of the growth of the crystal layer Pg on the substrate protrusion 51p was insufficient; and the decrease of the pit density Cp and the dislocation density was insufficient.

Although a reference example is conceivable in which the growth of the crystal layer Pg on the substrate protrusion 51p is suppressed by controlling the growth conditions of the nitride semiconductor layer that is formed on the substrate major surface 50a, the control of the growth conditions is difficult; the decrease of the pit density Cp is insufficient; and it is difficult to reduce the dislocation density.

Although there are reference examples that attempt to reduce the dislocation density by suppressing the growth of the nitride semiconductor layer at the substrate recess 51d by controlling the configuration of the substrate recess 51d, it is difficult to reduce the pit density using this method.

In contrast, in the embodiment, both the pit density Cp and the dislocation density can be reduced by the relationship between the dimensions of the substrate protrusion 51p and the dimensions of the substrate recess 51d (i.e., the relationship between the dimensions of the recess 61d of the first semiconductor layer 10 and the dimensions of the protrusion 61p) being appropriately set.

In a reference example in which an unevenness is formed in a first nitride semiconductor layer formed on a flat substrate and a second nitride semiconductor layer is formed on the first nitride semiconductor layer, the improvement effect of the light extraction efficiency is small because the refractive index difference between the first nitride semiconductor layer and the second nitride semiconductor layer is small.

Conversely, in the embodiment, the refractive index difference between the substrate 50 and the first semiconductor layer 10 is large and the improvement effect of the light extraction efficiency is large because the substrate unevenness 51 is provided in the substrate 50. Even in the case where the substrate 50 is removed, the light extraction efficiency can be greatly increased by the unevenness 61 being formed in the first major surface 60a of the first semiconductor layer 10.

In the embodiment, in the case where multiple substrate protrusions 51p are provided in the substrate 50, it is favorable for the multiple substrate protrusions 51p to be disposed two-dimensionally in a plane perpendicular to the Z-axis. In the case where multiple substrate recesses 51d are provided in the substrate 50, it is favorable for the multiple substrate recesses 51d to be disposed two-dimensionally in a plane perpendicular to the Z-axis. That is, the substrate structural bodies 51 may be disposed in a plane parallel to the substrate major surface 50a. Thereby, the effect of suppressing dislocations 65 occurring from the substrate protrusion 51p increases; the proportion of the dislocations of the first semiconductor layer 10 that are annihilated by colliding with the substrate side portion 51s increases due to extension directions of the dislocations changing to horizontal directions (directions intersecting the Z-axis); and the reduction effect of the dislocation density increases. Further, the light extraction efficiency can be greatly increased; and the luminous efficiency increases.

In the foundation layer 60, in the case where multiple recesses 61d are provided, it is favorable for the multiple recesses 61d to be disposed two-dimensionally in a plane perpendicular to the Z-axis. Also, in the foundation layer 60, in the case where multiple protrusions 61p are provided, it is favorable for the multiple protrusions 61p to be disposed two-dimensionally in a plane perpendicular to the Z-axis. That is, the structural bodies 61 may be disposed in a plane parallel to the first major surface 60a. Thereby, the effect of suppressing the dislocations 65 occurring at the recess 61d increases; the proportion of the dislocations of the first semiconductor layer 10 that are annihilated by colliding with the substrate side portion 51s due to the extension directions of the dislocations changing to horizontal directions (directions intersecting the Z-axis) increases; and the reduction effect of the dislocation density increases. Further, the light extraction efficiency can be greatly increased; and the luminous efficiency increases.

In other words, in the foundation layer 60, it is favorable for at least one selected from the protrusion 61p and the recess 61d to be multiply provided and disposed two-dimensionally in a plane perpendicular to the Z-axis direction.

FIG. 14A to FIG. 14H and FIG. 15A to FIG. 15H are schematic plan views illustrating configurations of semiconductor light emitting devices according to the first embodiment.

Namely, these drawings illustrate planar configurations and planar dispositions (configurations and dispositions when viewed along the Z-axis) of the unevenness 61 (the recess 61d and the protrusion 61p) and the substrate unevenness 51 (the substrate protrusion 51p and the substrate recess 51d) of the first semiconductor layer 10 (e.g., the foundation layer 60).

As illustrated in FIG. 14A to FIG. 14H and FIG. 15A to FIG. 15H, the substrate protrusion 51p and the substrate recess 51d may have various configurations such as triangles, quadrilaterals (including diamonds and parallelograms), hexagons, band configurations, and the like. The multiply-provided substrate protrusions 51p and the multiply-provided substrate recesses 51d may be disposed at the vertexes of the triangles, the centers and the vertexes of the hexagons, and the like. Similarly, the recess 61d and the protrusion 61p of the first semiconductor layer 10 may have various configurations such as triangles, quadrilaterals (including diamonds and parallelograms), hexagons, band configurations, and the like. The multiply-provided recesses 61d and the multiply-provided protrusions 61p may be disposed at the vertexes of the triangles, the centers and the vertexes of the hexagons, and the like. In addition to those recited above, various modifications of the planar configurations and the planar dispositions of the unevenness 61 and the substrate unevenness 51 are possible in the embodiment.

In the substrate 50, it is favorable for at least one selected from the multiple substrate protrusions 51p and the multiple substrate recesses 51d to be provided. Thereby, the dislocations of the first semiconductor layer 10 are annihilated by colliding with the substrate side portion 51s by the extension directions of the dislocations changing to horizontal directions (directions intersecting the Z-axis); and the dislocation density can be effectively reduced.

In the embodiment, the growth from the protrusion is suppressed when forming the nitride semiconductor layer on the substrate having an unevenness pattern; and the crystal grown from the recess combines with itself. Thereby, a nitride semiconductor layer having excellent flatness can be obtained. As a result, a semiconductor light emitting device having high reliability and light extraction efficiency can be realized.

The semiconductor light emitting device according to the embodiment can be applied to, for example, bluish green, green, and red laser diodes (LDs) as well as bluish green, green, or red LEDs.

Second Embodiment

The embodiment relates to a nitride semiconductor layer growth substrate for growing a nitride semiconductor layer.

The nitride semiconductor layer growth substrate includes the substrate 50 described in the first embodiment. In other words, the nitride semiconductor layer growth substrate (the substrate 50) has the substrate major surface 50a used to grow a nitride semiconductor layer (e.g., the semiconductor structural body 10s). The nitride semiconductor layer growth substrate has the multiple substrate structural bodies Sa provided in the substrate major surface 50a.

Each of the multiple substrate structural bodies Sa is the substrate protrusion 51p provided on the substrate major surface 50a; and the substrate recess 51d is provided between the multiple substrate structural bodies Sa. Or, each of the multiple substrate structural bodies Sa is the substrate recess 51d provided on the substrate major surface 50a; and the substrate protrusion 51p is provided between the multiple substrate structural bodies Sa.

In this case as well, the substrate protrusion height ha, the substrate protrusion width ra, and the substrate recess width Ra are set to satisfy the first formula and the second formula recited above. Thereby, the occurrence of the pits Pp can be suppressed; and a semiconductor light emitting device having a high efficiency can be constructed.

It is favorable for the ratio of the total surface area of the substrate apical portion 51t per unit surface area of the substrate major surface 50a to the total surface area of the substrate recess 51d the per unit surface area to be less than 0.17. Thereby, the occurrence of the pits Pp is effectively suppressed.

It is favorable for ha/(Ta−Ra−ra) to be not more than 0.6. Also, ha/(Ta−Ra−ra) is greater than 0. Thereby, for example, the occurrence of the oblique surface irregular growth layer Sg can be suppressed; and the dislocation density can be effectively reduced.

The nitride semiconductor layer growth substrate includes at least one selected from sapphire, silicon carbide (SiC), a silicon (Si) substrate, and gallium arsenide (GaAs).

Third Embodiment

The embodiment relates to a nitride semiconductor wafer.

Figure 16A:
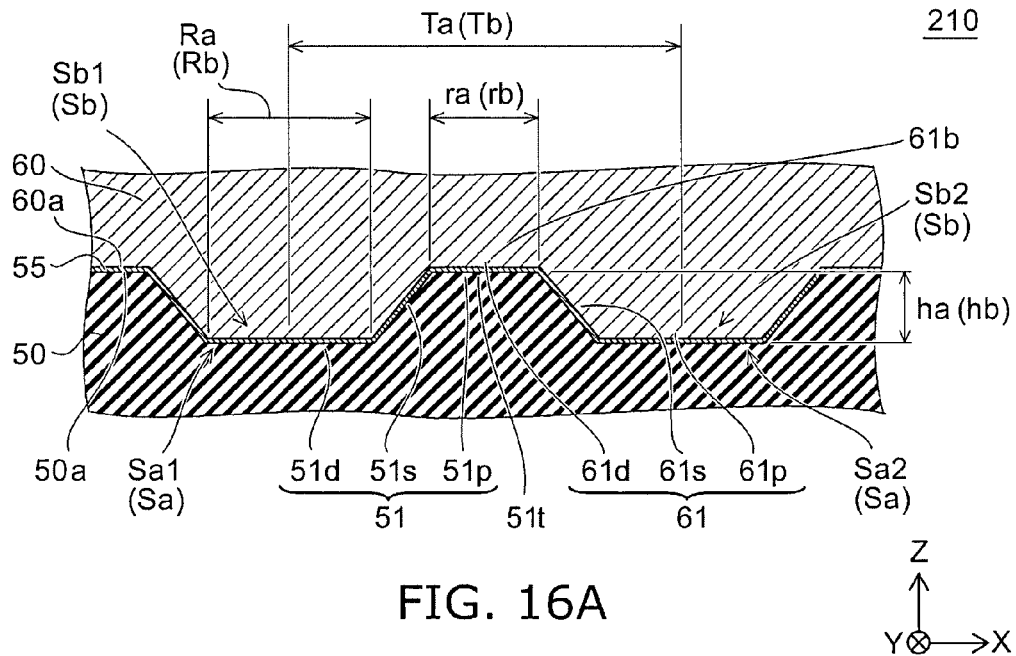
FIG. 16A and FIG. 16B are schematic cross-sectional views illustrating a nitride semiconductor wafers according to a third embodiment.
Figure 16B:
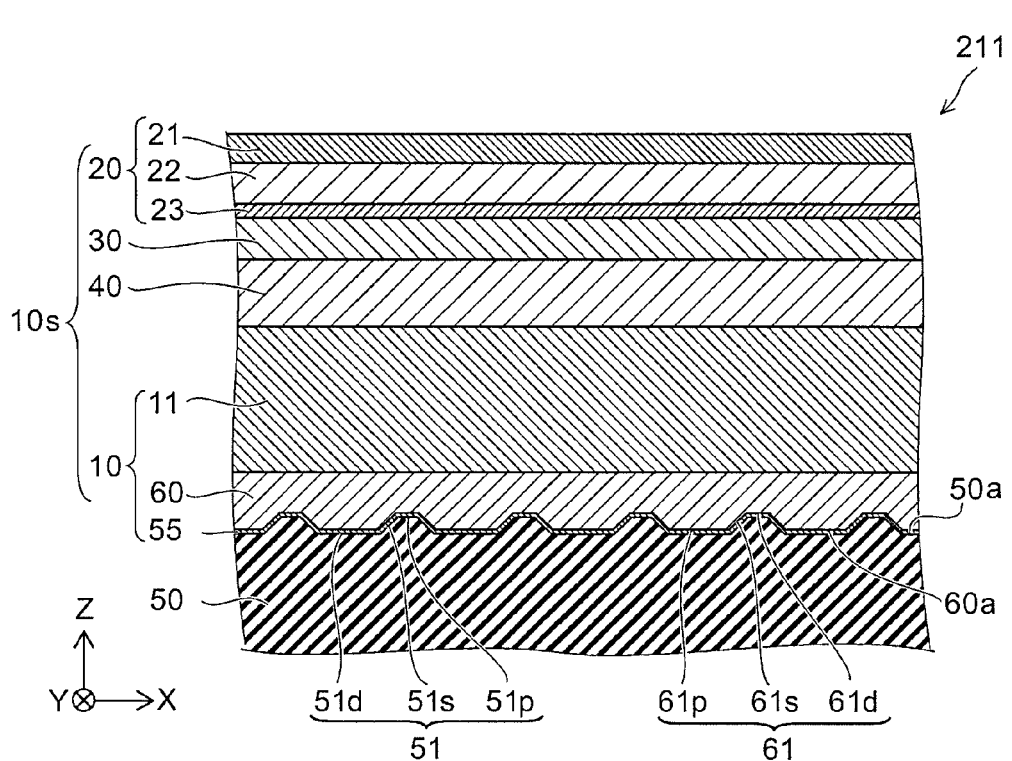

FIG. 16A and FIG. 16B are schematic cross-sectional views illustrating the configuration of nitride semiconductor wafers according to the third embodiment.

As illustrated in FIG. 16A and FIG. 16B, the nitride semiconductor wafers 210 and 211 according to the embodiment include the substrate 50 and a nitride semiconductor layer (e.g., a layer including the foundation layer 60) provided on the substrate 50.

In the nitride semiconductor wafer 210, the nitride semiconductor layer provided on the substrate 50 includes the foundation layer 60. The nitride semiconductor wafer 210 may be used as, for example, the foundation portion of the functioning unit of the semiconductor light emitting device. In other words, the nitride semiconductor wafer 210 may be used as at least a portion of the semiconductor light emitting device 110 or 120 described in the first embodiment. The nitride semiconductor wafer 210 may be used as, for example, at least a portion of a semiconductor layer included in the semiconductor light emitting device. Or, the nitride semiconductor wafer 210 may be applied to a semiconductor device that uses a nitride semiconductor layer such as a transistor (e.g., a HEMT) and the like.

In the nitride semiconductor wafer 211, the first semiconductor layer 10 (including the foundation layer 60), the multilayered film body 40, the light emitting layer 30, and the second semiconductor layer 20 are provided on the substrate 50. In other words, the nitride semiconductor wafer 211 may be used as at least a portion of the semiconductor layer included in the semiconductor light emitting device.

In the nitride semiconductor wafers 210 and 211, the substrate 50 has the substrate structural body Sa provided in the substrate major surface 50a on the nitride semiconductor layer side. The substrate structural body Sa contacts the nitride semiconductor layer.

Each of the multiple substrate structural bodies Sa is the substrate protrusion 51p provided on the substrate major surface 50a; and the substrate recess 51d is provided between the multiple substrate structural bodies Sa. Or, each of the multiple substrate structural bodies Sa is the substrate recess 51d provided on the substrate major surface 50a; and the substrate protrusion 51p is provided between the multiple substrate structural bodies Sa.

In the substrate 50, the first formula and the second formula recited above are satisfied. In the nitride semiconductor layer, the third formula and the fourth formula recited above are satisfied. Thereby, the occurrence of the pits Pp can be suppressed. Thereby, for example, a nitride semiconductor wafer can be provided to construct a semiconductor light emitting device having a high efficiency.

In the nitride semiconductor wafers 210 and 211 as well, it is favorable for the ratio of the total surface area of the substrate apical portion 51t per unit surface area of the substrate major surface 50a to the total surface area of the substrate recess 51d per the unit surface area to be less than 0.17. Thereby, the occurrence of the pits Pp is effectively suppressed.

It is favorable for ha/(Ta−Ra−ra) to be not more than 0.6. Also, ha/(Ta−Ra−ra) is greater than 0. Thereby, for example, the occurrence of the oblique surface irregular growth layer Sg is suppressed; and the dislocation density can be effectively reduced.

The substrate 50 includes at least one selected from sapphire, silicon carbide (SiC), silicon (Si) substrate, and gallium arsenide (GaAs).

A nitride semiconductor layer (e.g., the semiconductor structural body 10s) is provided on the substrate 50 and includes the first semiconductor layer 10 that includes a layer of the first conductivity type, the light emitting layer 30 provided on the first semiconductor layer 10, and the second semiconductor layer 20 provided on the light emitting layer 30, where the second semiconductor layer 20 includes a layer of the second conductivity type that is different from the first conductivity type. The first semiconductor layer 10 is made of a nitride semiconductor.

According to the embodiment, a semiconductor light emitting device having a high efficiency, a nitride semiconductor layer growth substrate, and a nitride semiconductor wafer can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the compositional proportions x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in semiconductor light emitting devices or nitride semiconductor wafers such as substrates, buffer layers, foundation layers, semiconductor layers, light emitting layers, electrodes, and the like from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all semiconductor light emitting devices, nitride semiconductor layer growth substrates, and nitride semiconductor wafers practicable by an appropriate design modification by one skilled in the art based on the semiconductor light emitting devices, the nitride semiconductor layer growth substrates, and the nitride semiconductor wafers described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
   a first semiconductor layer including a layer of a first conductivity type;
   a second semiconductor layer apart from a first direction, the second semiconductor layer including a layer of a second conductivity type different from the first conductivity type; and
   a light emitting layer provided between the first semiconductor layer and the second semiconductor layer, the first semiconductor layer having a first surface and a second surface, the second surface opposing the light emitting layer, the first surface being opposite to the second surface, the first surface including a plurality of bottom faces and an apical face, a distance between one of the bottom faces and the second surface in the first direction being less than a distance between the apical face and the second surface in the first direction, the bottom faces includes a first face and a second face nearest to the first face, the first face having a first centroid, the second face having a second centroid, the first centroid aligning with the second centroid along a second axis, and hb and rb satisfying $$rb/(2 \cdot hb) \leq 0.7,$$

where
 hb is a distance between the first face and the apical face in the first direction, and
 rb is a width of the first face along the second axis.

2. The device according to claim 1, wherein a ratio of a total surface area of the bottom faces per unit surface area of the first surface to a total surface area of the apical face per the unit surface area of the first surface is less than 0.17.

3. The device according to claim 2, the ratio of the total surface area of the bottom faces per the unit surface area of the first surface to the total surface area of the apical face per the unit surface area of the first surface is not more than 0.11.

4. The device according to claim 1, wherein hb/(Tb-Rb-rb) is not more than 0.6, where Tb is a distance between the first centroid and the second centroid along the second axis, and Rb is a width of the apical face along the second axis.

5. The device according to claim 4, wherein the hb/(Tb-Rb-rb) is not more than 0.59.

6. The device according to claim 4, wherein the hb/(Tb-Rb-rb) is not more than 0.5.

7. The device according to claim 1, further comprising a substrate, the substrate having a plurality of substrate structural bodies conforming to the first surface.

8. The device according to claim 7, wherein the substrate includes at least one of sapphire, silicon carbide (SiC), silicon (Si), and gallium arsenide (GaAs).

9. The device according to claim 1, wherein the first semiconductor layer, the second semiconductor layer, and the light emitting layer include a nitride semiconductor.

10. The device according to claim 1, wherein the bottom faces are disposed in a plane parallel to the second surface.

11. The device according to claim 1, wherein
 Rb is a width of the apical face along the second axis,
 the hb is 0.5 micrometers or more and 3 micrometers or less,
 the rb is 0.5 micrometers or more and 4 micrometers or less, and
 the Rb is 0.5 micrometers or more and 4 micrometers or less.

12. The device according to claim 1, wherein a peak wavelength of light emitted from the light emitting layer is 400 nanometers or more and 650 nanometers or less.

13. The device according to claim 1, wherein one of the bottom faces is a circle.

14. The device according to claim 1, wherein a position of the apical face in the second axis is located between a position of the first face in the second axis and a position of the second face in the second axis.

15. A wafer comprising:
 a substrate,
 the substrate having a substrate surface, a nitride semiconductor layer being to be formed on the substrate surface,
 the substrate surface including a plurality of protrusions,
 the protrusions including a first apical face and a second apical face nearest to the first apical face, the first apical face having a first centroid, the second apical face having a second centroid, the first centroid aligning with the second centroid along a second axis; and
 ha and ra satisfying $$ra/(2 \cdot ha) \leq 0.7,$$

where
 ha is a height of the protrusion, and
 ra is a width of the first apical face along the second axis.

16. The wafer according to claim 15, wherein a ratio of a total surface area of apical faces of the protrusions per unit surface area of the substrate surface to a total surface area of a bottom face of the substrate surface per the unit surface area of the substrate surface is less than 0.17.

17. The wafer according to claim 16, the ratio of the total surface area of the apical faces per the unit surface area of the substrate surface to the total surface area of the bottom face per the unit surface area of the substrate surface is not more than 0.11.

18. The wafer according to claim 15, wherein ha/(Ta-Ra-ra) is not more than 0.6, where Ta is a distance between the first centroid and the second centroid along the second axis and Ra is a width of the bottom face along the second axis.

19. The wafer according to claim 18, wherein the ha/(Ta-Ra-ra) is not more than 0.59.

20. The wafer according to claim 18, wherein the ha/(Ta-Ra-ra) is not more than 0.5.

21. The wafer according to claim 15, wherein the substrate includes at least one of sapphire, silicon carbide (SiC), silicon (Si), and gallium arsenide (GaAs).

22. The wafer according to claim 15, wherein
 Ra is a width of the bottom face along the second axis,
 the ha is 0.5 micrometers or more and 3 micrometers or less,
 the ra is 0.5 micrometers or more and 4 micrometers or less, and
 the Ra is 0.5 micrometers or more and 4 micrometers or less.

23. The device according to claim 1, wherein
 the rb/Rb is not more than 0.6, and
 where Rb is a width of the apical face along the second axis.

24. The device according to claim 23, wherein the rb/Rb is not less than 0.25.

25. The device according to claim 23, wherein hb/(Tb-Rb-rb) is not more than 0.6, where Tb is a distance between the first centroid and the second centroid along the second axis.

26. The device according to claim 25, wherein the hb/(Tb-Rb-rb) is not more than 0.59.

27. The device according to claim 25, wherein the hb/(Tb-Rb-rb) is not more than 0.5.

28. The wafer according to claim 15,
 wherein the ra/Ra is not more than 0.6, and
 where Ra is a width of the bottom face along the second axis.

29. The wafer according to claim 28, wherein the ra/Ra is not less than 0.25.

30. The wafer according to claim 28, wherein ha/(Ta-Ra-ra) is not more than 0.6, where Ta is a distance between the first centroid and the second centroid along the second axis.

31. The wafer according to claim 30, wherein the ha/(Ta-Ra-ra) is not more than 0.59.

32. The wafer according to claim 30, wherein the ha/(Ta-Ra-ra) is not more than 0.5.

33. A semiconductor light emitting device, comprising:
a substrate, the substrate having a substrate surface;
a first semiconductor layer provided on the substrate surface, the first semiconductor layer including a layer of a first conductivity type;
a light emitting layer provided on the first semiconductor layer; and
a second semiconductor layer provided on the first semiconductor layer, the second semiconductor layer including a layer of a second conductivity type different from the first conductivity type,
the substrate surface including a plurality of protrusions,
the protrusions including a first apical face and a second apical face nearest to the first apical face,
the first apical face having a first centroid, the second apical face having a second centroid, the first centroid aligning with the second centroid along a second axis, and
ha and ra satisfying $$ra/(2 \cdot ha) \leq 0.7,$$

where
ha is a height of the protrusion, and
ra is a width of the first apical face along the second axis.

34. The device according to claim 33, wherein
the ra/Ra is not more than 0.6, and
where Ra is a width of a bottom face of the substrate surface along the second axis.

35. The device according to claim 34, wherein the ra/Ra is not less than 0.25.

36. The device according to claim 34, wherein ha/(Ta-Ra-ra) is not more than 0.6, where Ta is a distance between the first centroid and the second centroid along the second axis.

37. The device according to claim 36, wherein the ha/(Ta-Ra-ra) is not more than 0.59.

38. The device according to claim 36, wherein the ha/(Ta-Ra-ra) is not more than 0.5.

39. The device according to claim 33, wherein a ratio of a total surface area of apical faces of the protrusions per unit surface area of the substrate surface to a total surface area of the a bottom face of the substrate surface per the unit surface area of the substrate surface is less than 0.17.

40. The device according to claim 33, wherein ha/(Ta-Ra-ra) is not more than 0.6, where Ta is a distance between the first centroid and the second centroid along the second axis, and Ra is a width of a bottom face of the substrate face along the second axis.

41. The device according to claim 33, wherein the substrate includes at least one of sapphire, silicon carbide (SiC), silicon (Si), and gallium arsenide (GaAs).

42. The device according to claim 33, wherein
Ra is a width of a bottom face of the substrate surface along the second axis,
the ha is 0.5 micrometers or more and 3 micrometers or less,
the ra is 0.5 micrometers or more and 4 micrometers or less, and
the Ra is 0.5 micrometers or more and 4 micrometers or less.

43. The device according to claim 33, wherein
each of the first apical face and the second apical face is hexagonal.

44. The device according to claim 43, wherein
a side of the first apical face is parallel to a side of the second apical face.

45. The device according to claim 33, wherein
each of the first apical face and the second apical face is regular hexagonal.

46. The device according to claim 33, wherein
each of the first apical face and the second apical face is triangular.

47. The device according to claim 46, wherein
a side of the first apical face is parallel to a side of the second apical face.

48. The device according to claim 33, wherein
each of the first apical face and the second apical face is regular triangular.

49. The device according to claim 33, wherein
each of the first apical face and the second apical face is triangular,
a side of the first apical face located on an extension of a side of the second apical face.

50. The device according to claim 49, wherein
each of the first apical face and the second apical face is right regular triangular.

* * * * *